US012791898B2

(12) United States Patent
Li et al.

(10) Patent No.: US 12,791,898 B2
(45) Date of Patent: Nov. 10, 2026

(54) DISPLAY SUBSTRATE

(71) Applicants: Chongqing BOE Optoelectronics Technology Co., Ltd., Chongqing (CN); BOE Technology Group Co., Ltd., Beijing (CN); Beijing BOE Technology Development Co., Ltd., Beijing (CN)

(72) Inventors: Xiaoji Li, Beijing (CN); Yanli Zhao, Beijing (CN); Zhe Li, Beijing (CN); Zhifu Dong, Beijing (CN); Hui Guo, Beijing (CN); Peng Li, Beijing (CN); Yukun Jia, Beijing (CN)

(73) Assignees: Chongqing BOE Optoelectronics Technology Co., Ltd., Chongqing (CN); Beijing BOE Technology Development Co., Ltd., Beijing (CN)

( * ) Notice: Subject to any disclaimer, the term of this patent is extended or adjusted under 35 U.S.C. 154(b) by 352 days.

(21) Appl. No.: 18/708,332

(22) PCT Filed: Apr. 27, 2023

(86) PCT No.: PCT/CN2023/091036

§ 371 (c)(1),
(2) Date: May 8, 2024

(87) PCT Pub. No.: WO2024/221310

PCT Pub. Date: Oct. 31, 2024

(65) Prior Publication Data

US 2025/0013107 A1 Jan. 9, 2025

(51) Int. Cl.
*H10D 86/40* (2025.01)
*G02F 1/1333* (2006.01)
(Continued)

(52) U.S. Cl.
CPC .... *G02F 1/134345* (2021.01); *G02F 1/13338* (2013.01); *G02F 1/13439* (2013.01);
(Continued)

(58) Field of Classification Search
CPC ........... G02F 1/134345; G02F 1/13338; G02F 1/13439; G02F 1/136286; G02F 1/1368;
(Continued)

(56) References Cited

U.S. PATENT DOCUMENTS 8,773,341 B2 * 7/2014 Takano ............. G02F 1/136227 349/139
2009/0015774 A1 * 1/2009 Asakura ............ G02F 1/134363 349/139
(Continued)

FOREIGN PATENT DOCUMENTS

CN 1690790 A 11/2005
CN 101750821 A 6/2010
(Continued)

*Primary Examiner* — Amy Onyekaba
(74) *Attorney, Agent, or Firm* — Nath, Goldberg & Meyer; Joshua B. Goldberg

(57) ABSTRACT

A display substrate, including a substrate having multiple sub-pixel regions, at least one sub-pixel region includes: a first electrode and a second electrode on the substrate and insulated from each other, the second electrode being located on a side of the first electrode away from the substrate; the second electrode includes multiple electrode bars arranged in parallel along a first direction, a first slit is formed between every two adjacent electrode bars in any second electrode; in the first direction, a width of the electrode bar is smaller than that of the sub-pixel region each sub-pixel region includes at least three electrode bars; a ratio of a width of at least one electrode bar to that of the sub-pixel
(Continued)

region ranges from 0.06 to 0.3, and one of the first electrode or the second electrode is a pixel electrode, and the other is a common electrode.

20 Claims, 15 Drawing Sheets

(51) Int. Cl.

| | |
|---|---|
| ***G02F 1/1343*** | (2006.01) |
| ***G02F 1/1362*** | (2006.01) |
| ***G02F 1/1368*** | (2006.01) |
| ***H10D 86/60*** | (2025.01) |

(52) U.S. Cl.
CPC ...... *G02F 1/136286* (2013.01); *G02F 1/1368* (2013.01); *H10D 86/441* (2025.01); *H10D 86/60* (2025.01)

(58) Field of Classification Search
CPC ............ G02F 1/134372; G02F 1/1343; H10D 86/441; H10D 86/60; H10D 86/423
See application file for complete search history.

(56) References Cited

U.S. PATENT DOCUMENTS

| | | | | |
|---|---|---|---|---|
| 2013/0099239 | A1* | 4/2013 | Ishii | G09G 1/00 257/59 |
| 2017/0038646 | A1* | 2/2017 | Song | G02F 1/134309 |
| 2017/0168357 | A1* | 6/2017 | Kim | G02F 1/133707 |
| 2019/0384131 | A1* | 12/2019 | Liu | G02F 1/134309 |
| 2020/0326599 | A1* | 10/2020 | Fan | G02F 1/134363 |
| 2021/0341803 | A1* | 11/2021 | Kim | G02F 1/133707 |
| 2022/0004063 | A1* | 1/2022 | Wang | G02F 1/134345 |
| 2022/0373843 | A1* | 11/2022 | Chen | G02F 1/136286 |

FOREIGN PATENT DOCUMENTS

| | | | |
|---|---|---|---|
| CN | 105467701 | A | 4/2016 |
| CN | 205507295 | A | 8/2016 |
| CN | 106773227 | A | 5/2017 |
| CN | 110231739 | A | 9/2019 |
| CN | 105531621 | B | 11/2019 |
| CN | 110737141 | A | 1/2020 |
| CN | 110908194 | A | 3/2020 |
| CN | 115542619 | A | 12/2022 |
| KR | 20210089565 | A | 7/2021 |
| WO | WO2023000971 | A1 * | 1/2023 |

* cited by examiner

DISPLAY SUBSTRATE

This is a National Phase Application filed under 35 U.S.C. 371 as a national stage of PCT/CN2023/091036, filed Apr. 27, 2023, the content of which is hereby incorporated by reference in its entirety.

TECHNICAL FIELD

The present disclosure relates to the field of display technology, and in particular to a display substrate.

BACKGROUND

The power consumption of the liquid crystal display device during being used can be reduced by lowering the operation frequency of the liquid crystal display device, so as to prolong the service time of the liquid crystal display device. However, for certain images of the liquid crystal display panel, as the frequency changing, since the transmittance of the liquid crystal molecules may be different due to the flexoelectric effect during the polarities of the liquid crystal molecules being inverted, flicker of the images may occur and a decrease in display quality is resulted in.

SUMMARY

The present disclosure provides a display substrate, including a substrate, the substrate includes a plurality of sub-pixel regions, at least one of the sub-pixel regions includes: a first electrode and a second electrode arranged on the substrate, the second electrode being located on a side of the first electrode away from the substrate, and the second electrode and the first electrode being insulated from each other;

- the second electrode includes a plurality of electrode bars which are arranged in parallel along a first direction, and a first slit is formed between every two adjacent electrode bars in each second electrode; a width of the electrode bar in the first direction is smaller than a width of the sub-pixel region in the first direction, and each sub-pixel region includes at least three electrode bars therein; a ratio of a width of at least one of the electrode bars to the width of the sub-pixel region corresponding thereto ranges from 0.06 to 0.3, and
- one of the first electrode or the second electrode is a pixel electrode, and the other of the first electrode or the second electrode is a common electrode.

In some implementations, a ratio of the width of at least one of the electrode bars in the first direction to a width of the first slit adjacent to the electrode bar ranges from 0.4 to 1.3.

In some implementations, 750 to 900 sub-pixel regions are arranged per inch of length in the first direction, and the width of the electrode bar in the first direction ranges from 1.8 μm to 4 μm.

In some implementations, a change value between transmittances of the display substrate in two adjacent frames and the width of the electrode bar satisfy the following relational formula:

$$A = (-0.0228W + 0.1348) \times k,$$

W is the width of the electrode bar, A is the change value between transmittances of the display substrate in two adjacent frames, k is an error coefficient, and k is greater than 0 and less than 3.

In some implementations, the display substrate further includes:

- a plurality of gate lines arranged in a second direction, the second direction being the same as or different from the first direction; and
- a plurality of thin film transistors, each thin film transistor is electrically connected with the pixel electrode of one of the sub-pixel regions and is electrically connected with one of the gate lines.

In some implementations, the plurality of thin film transistors include a plurality of first thin film transistors and a plurality of second thin film transistors, a width of a gate electrode of the first thin film transistor in the second direction is larger than a width of a gate electrode of the second thin film transistor in the second direction; and

- the display substrate further includes a plurality of first support parts located on a side of gate electrodes of the first thin film transistors away from the substrate, and an orthographic projection of each first support part on the substrate is overlapped with an orthographic projection of the gate electrode of one of the first thin film transistors on the substrate.

In some implementations, the first support parts are disposed in the same layer as source electrodes and drain electrodes of the thin film transistors.

In some implementations, a difference between widths of the gate electrode of the first thin film transistor and the gate electrode of the second thin film transistor in the second direction is in a range from 6 μm to 10 μm.

In some implementations, the display substrate further includes a plurality of second support parts, an orthographic projection of each second support part on the substrate is overlapped with an orthographic projection of one of the first support parts on the substrate,

- the second support parts and active layers of the thin film transistors are disposed in a same layer.

In some implementations, an orthographic projection of at least a portion of the gate line on the substrate is not overlapped with an orthographic projection of the first electrode on the substrate.

In some implementations, the display substrate further includes:

- a plurality of data lines, each of the plurality of data lines extending in a third direction, the third direction intersecting the second direction,
- an orthographic projection of each data line on the substrate is overlapped with orthographic projections of gate electrodes of the thin film transistors on the substrate; at least one edge of each data line is provided with a recess, and an orthographic projection of the recess on the substrate is located in an orthographic projection of the gate electrode of the thin film transistor on the substrate.

In some implementations, a depth of the recess is less than or equal to half a width of the data line.

In some implementations, the display substrate further includes:

- a plurality of touch signal lines arranged in the same layer as source electrodes and drain electrodes of the thin film transistors, each of the plurality of touch signal lines extending in the third direction,
- the first electrode is reused as a touch electrode and is electrically connected with the touch signal lines.

In some implementations, a width of each touch signal line is 1.5 to 3 times a width of the data line.

In some implementations, first electrodes of the plurality of sub-pixel regions constitute a first electrode layer, the first electrode layer includes: a plurality of first sub-electrodes arranged in an array along the second direction and the third direction; and a second slit is arranged between every two adjacent first sub-electrodes arranged in the second direction, and an orthographic projection of the second slit on the substrate is overlapped with an orthographic projection of the touch signal line on the substrate.

In some implementations, a width of the second slit is greater than or equal to a width of the touch signal line.

In some implementations, the display substrate further includes:

a plurality of third support parts arranged in the same layer as the gate lines, and an orthographic projection of each third support part on the substrate is overlapped with an orthographic projection of one of the touch signal lines on the substrate; and a plurality of fourth support parts arranged in the same layer as active layers of the thin film transistors; each fourth support part corresponds to one of the third support parts, and an orthographic projection of the fourth support part on the substrate is overlapped with an orthographic projection of the one of the third support parts on the substrate.

In some implementations, an orthographic projection of the first sub-electrode on the substrate is overlapped with an orthographic projection of the second electrode on the substrate;

the first sub-electrode, and the second electrode having the orthographic projection on the substrate overlapped with the orthographic projection of the first sub-electrode on the substrate form an electrode unit, in each electrode unit, the first sub-electrode includes a first edge and a second edge which are oppositely arranged in the third direction, the first edge is adjacent to the thin film transistor connected with the second electrode, the first edge is provided with a bent portion, and the bent portion is opposite to a drain electrode of the thin film transistor adjacent thereto and is bent in a direction away from the thin film transistor.

In some implementations, the second electrode further includes a connection portion connected with the plurality of electrode bars, an orthographic projection of at least a part of the connection portion on the substrate is located outside an orthographic projection of the first electrode on the substrate, and the connection portion is connected to a drain electrode of the thin film transistor through a first via hole; and an orthographic projection of the first via hole on the substrate is located outside the orthographic projection of the first electrode on the substrate.

In some implementations, in response to that a driving frequency of the display substrate is 60 Hz and driving voltages in each sub-pixel region in two adjacent frames are opposite in polarity, a flicker value of the display substrate is less than-30 dB.

In some implementations, the display substrate further includes:

a plurality of thin film transistors arranged between a layer where the first electrode is located and the substrate;

a first passivation layer arranged between the plurality of thin film transistors and the layer where the first electrode is located;

a second passivation layer arranged between the layer where the first electrode is located and a layer where the second electrode is located;

a plurality of touch signal lines arranged in the same layer as a source electrode and a drain electrode of each of the thin film transistors;

a plurality of transfer electrodes arranged in the same layer as the second electrode, the second electrode is connected to the drain electrode of the thin film transistor through a first via hole penetrating through the first passivation layer and the second passivation layer;

each transfer electrode is electrically connected with the first electrode through a second via hole penetrating through the second passivation layer and is connected with the touch signal line through a third via hole penetrating through the first passivation layer and the second passivation layer.

In some implementations, the second via hole and the third via hole corresponding to each transfer electrode are communicated.

BRIEF DESCRIPTION OF DRAWINGS

The accompanying drawings are intended to provide a further understanding of the present disclosure and constitute a part of the present specification, and are combined with the following embodiments to explain the present disclosure, but do not constitute a limitation of the present disclosure. In the drawings.

DETAIL DESCRIPTION OF EMBODIMENTS

Figure 1:
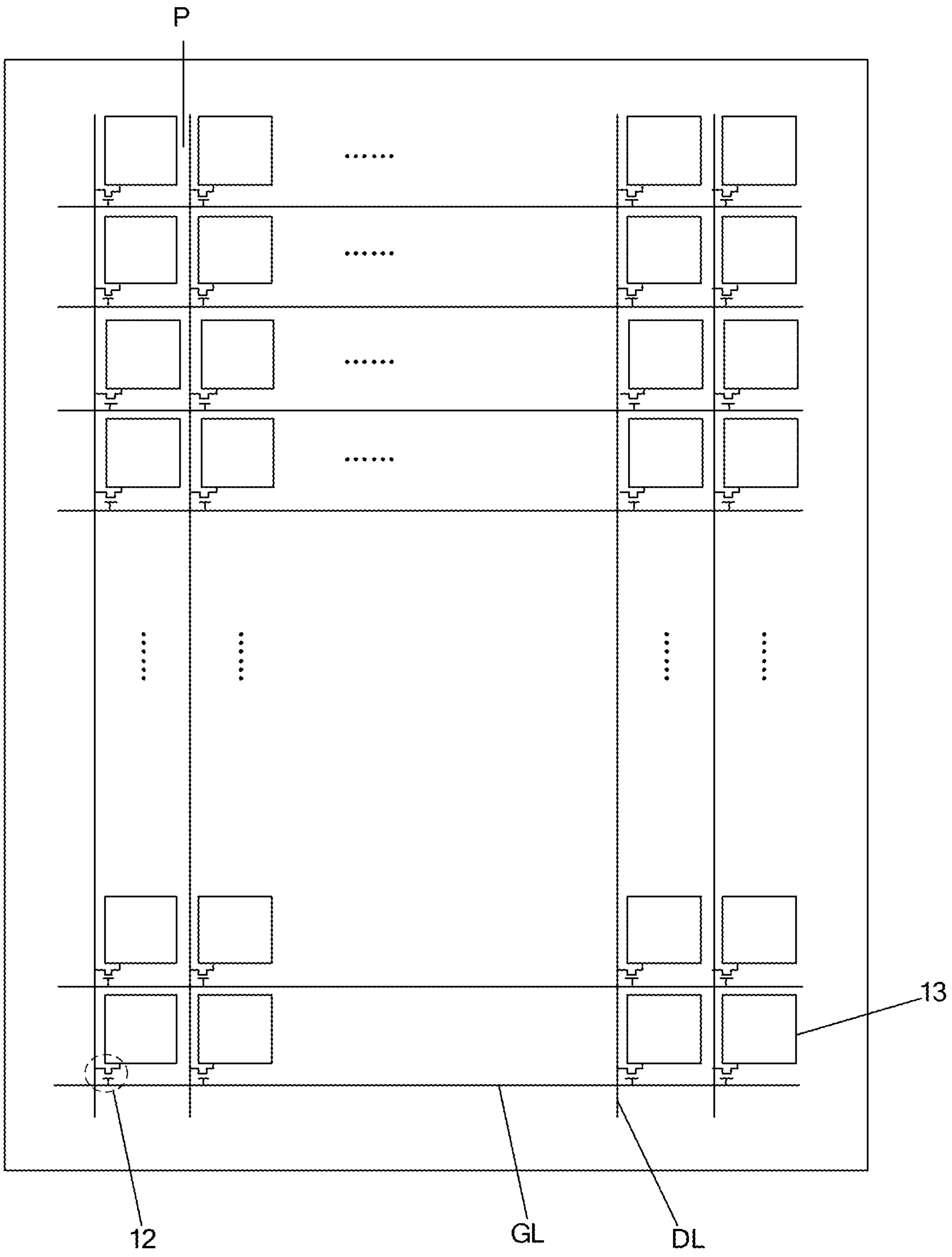
FIG. 1 is a schematic diagram illustrating a region division of a display substrate provided in some embodiments.

The embodiments of the present disclosure will be described in detail below with reference to the accompanying drawings. It should be understood that the embodiments described here are only intended to illustrate and explain the present disclosure, and are not intended to limit the present disclosure.

To make the objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a few of embodiments of the present disclosure, and not all embodiments. All other embodiments, which can be derived by a person skilled in the art from the described embodiments of the present disclosure without any creative effort, are within the protection scope of the present disclosure.

Unless defined otherwise, technical or scientific terms used herein shall have the ordinary meaning as understood by those skilled in the art to which the present disclosure belongs. The use of “first”, “second”, and the like in the present disclosure is not intended to indicate any order, quantity, or importance, but rather is used to distinguish one element from another. Also, the use of the terms “a”, “an”, “the” or similar referents do not denote a limitation of quantity, but rather denote the presence of at least one. Similarly, the word “comprising/including” or “comprises/includes”, and the like, means that the element or item preceding the word includes the element or item listed after the word and its equivalent, but does not exclude other elements or items. The terms “connected/connecting” or “coupled/coupling” and the like are not restricted to physical or mechanical connections, but may include electrical connections, whether direct or indirect. The words “upper”, “lower”, “left”, “right”, and the like are used only to indicate relative positional relationships, and when the absolute position of the object being described is changed, the relative positional relationships may also be changed accordingly.

As used herein, “parallel” and “perpendicular” include the described case and cases approximate to the described case, the cases approximate to the described case are deviated from the described case in an acceptable range of deviation as determined by one of ordinary skill in the art in view of the measurement in question and an error associated with the measurement of the particular quantity (i.e., the limitations of the measurement system). For example, “parallel” includes absolute parallel and approximate parallel, an acceptable range of deviation of approximate parallel may be, for example, within 10°; “perpendicular” includes absolute perpendicular and approximate perpendicular, an acceptable range of deviation of approximate perpendicular may also be, for example, within 10°.

It will be understood that in a case where a layer or element is referred to as being “on” another layer or a substrate, it may be directly on another layer or the substrate, or intervening layers may also be present between the layer or element and another layer or the substrate.

Example embodiments are described herein with reference to cross-sectional and/or plan views serving as idealized example Figures. In the drawings, the thicknesses of layers and regions are exaggerated for clarity. Therefore, variations from the shapes in the drawings as a result, for example, of manufacturing techniques and/or tolerances, are conceivable, the example embodiments should not be construed as limited to the shapes of regions illustrated herein but include deviations in shapes caused in manufacturing. For example, an etched region shown as a rectangle generally has curved features. As such, the regions illustrated in the drawings are schematic in nature and their shapes are not intended to illustrate the actual shapes of the regions of a device and are not intended to limit the scope of the exemplary embodiments.

Figure 2:
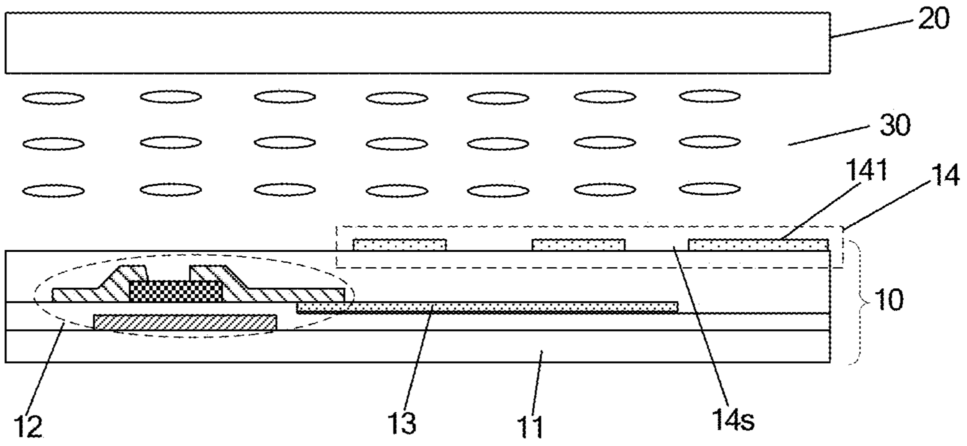
FIG. 2 is a cross-sectional view of a display panel provided in some embodiments.

FIG. 1 is a schematic diagram illustrating a region division of a display substrate provided in some embodiments, and FIG. 2 is a cross-sectional view of a display panel provided in some embodiments, and as shown in FIGS. 1 and 2, the display panel includes: a display substrate 10 and a color filter substrate 20 arranged oppositely, and a liquid crystal layer located between the display substrate 10 and the color filter substrate 20. The display substrate 10 includes: a substrate 11, and a plurality of gate lines GL, a plurality of data lines DL, a plurality of thin film transistors 12, a plurality of pixel electrodes 13, and a common electrode 14 disposed on the substrate 11. The gate lines GL intersect with the data lines DL, so as to divide a display area into a plurality of sub-pixel regions P, each sub-pixel region P is provided therein with one of the pixel electrodes 13, and each sub-pixel region P corresponds to one of the thin film transistors 12. A gate electrode of each thin film transistor 12 is connected to one of the gate lines GL, a source electrode of each thin film transistor 12 is connected to one of the data lines DL, and a drain electrode of each thin film transistor 12 is connected to one of the pixel electrodes 13. The common electrode 14 is disposed on a side of a layer, where the pixel electrodes 13 are located, away from the substrate 11, a portion of the common electrode 14 corresponding to the sub-pixel regions P includes a plurality of electrode bars 141, and a slit **14*s* is disposed between every two adjacent electrode bars 141, so that a horizontal electric field is formed between the common electrode 14 and the pixel electrodes 13** to drive liquid crystal molecules in the sub-pixel regions P to deflect.

In order to prevent polarization of liquid crystal molecules, during driving the display panel, the display substrate is usually driven by a mode of inverting polarities. That is, polarities of pixel voltages loaded on the pixel electrodes in a same sub-pixel region are opposite in two adjacent display periods. In addition, during driving the display panel, the power consumption of the display panel during being used is generally reduced by reducing the operation frequency of the display panel, so as to prolong the service time. However, the display panel may have a difference in transmittance due to the flexoelectric effect of the liquid crystal molecules during the polarities of the liquid crystal molecules being inverted, which may cause a flicker of the image and reduce the display quality.

The flexoelectric effect of the liquid crystal molecules refers to electric polarization caused by splay deformation and bend deformation of the liquid crystal molecules, is a ubiquitous phenomenon, especially for wedge-shaped and banana-shaped nematic liquid crystals having permanent dipole moment. The flexoelectric polarization strength vector expression is $P=e_{11}n(\nabla\cdot n)+e_{33}(\nabla\times n)\times n$, n is a liquid crystal director, and $e_{11}$ and $e_{33}$ correspond to a splay flexoelectric coefficient and a bend flexoelectric coefficient, respectively. The flexoelectric polarization and an externally applied electric field can cause a change in the liquid crystal director, which is a flexoelectric effect that easily to be concealed by a dielectric effect, or a substrate anchoring effect, but is significant under the influence of low-frequency (e.g., less than 20 Hz) and DC voltage signals. The response of the permanent dipole moment of the liquid crystal molecules to the electric field enhances or weakens the externally applied electric field, thereby leading to different rotation angles of the liquid crystal molecules in positive and negative frames under the electric field, leading to the difference between transmittances in the positive and negative frames, which represents flicker to be recognized by human eyes at low frequencies.

Figure 3:
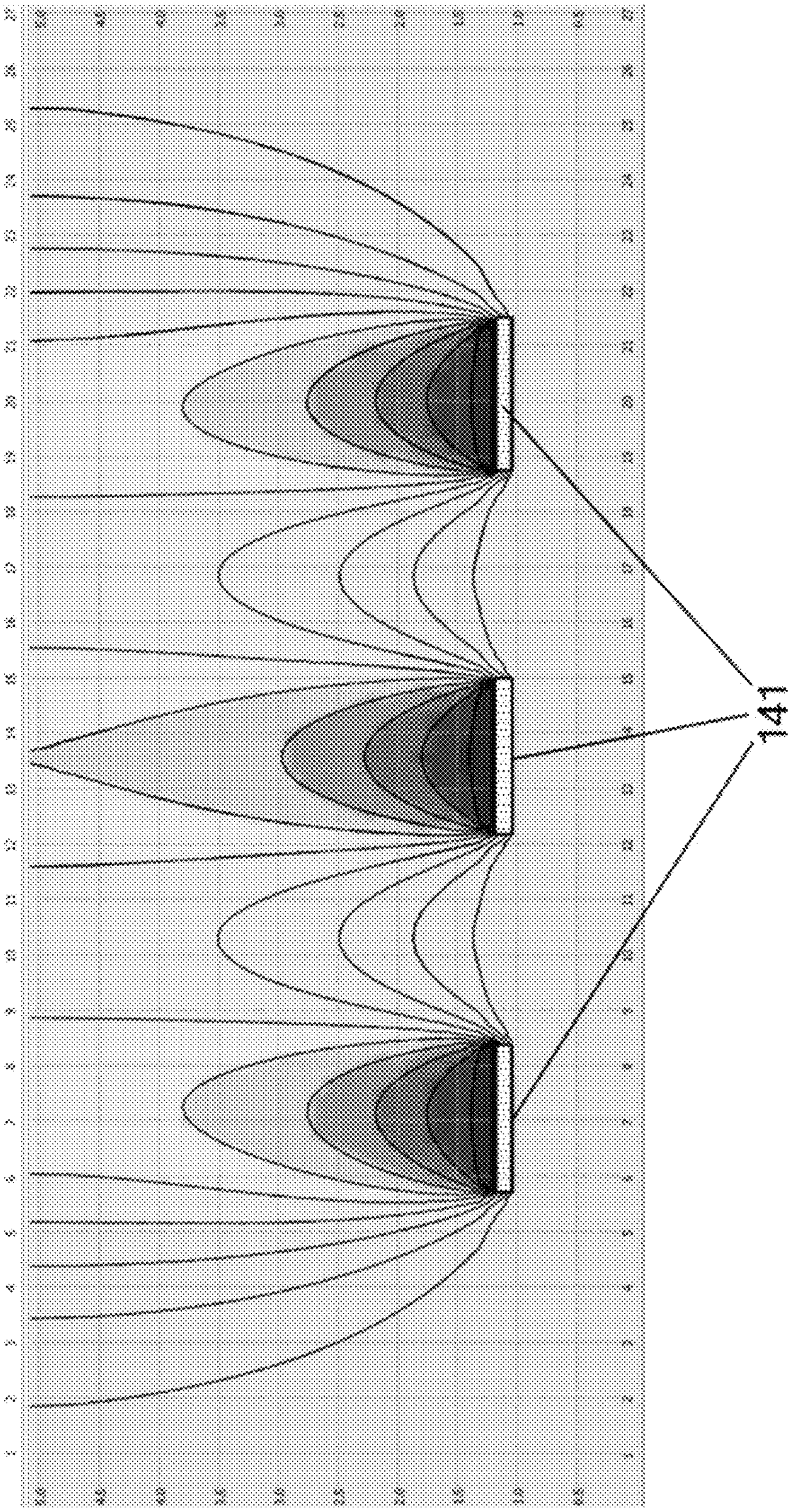
FIGS. 3 and 4 are potential diagrams of a sub-pixel region in two adjacent frames.
Figure 4:
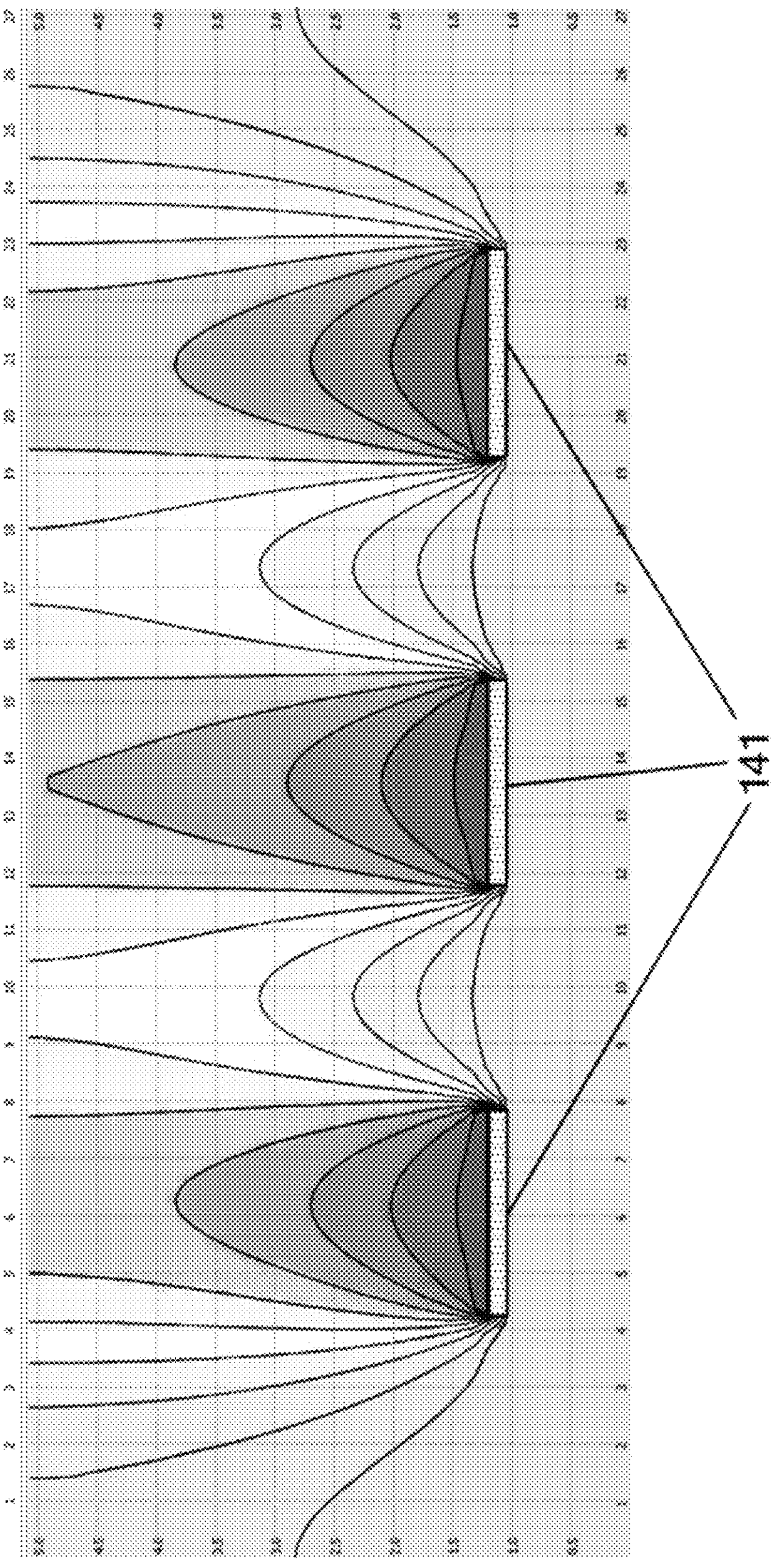

FIGS. 3 and 4 are potential diagrams of a sub-pixel region in two adjacent frames, and as shown in FIGS. 3 and 4, at a position corresponding to the electrode bar 141, the electric field is strongest, that is, the flexoelectric effect of the liquid crystal molecules at the electrode bar 141 is strongest, and the difference between transmittances of the display substrate in two adjacent frames is largest in a region where the electrode bar 141 is located.

Figure 5:
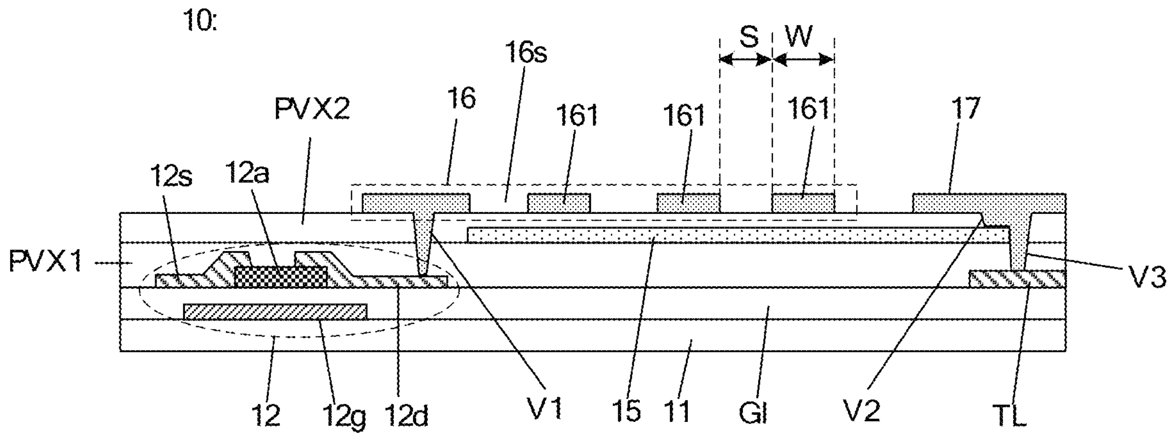
FIG. 5 is a cross-sectional view of a display substrate provided in some embodiments of the present disclosure.

An embodiment of the present disclosure provides a display substrate, and FIG. 5 is a cross-sectional view of a display substrate provided in some embodiments of the present disclosure, and as shown in FIG. 5, the display substrate includes a substrate 11, and the substrate includes a plurality of sub-pixel regions, for example, a plurality of gate lines and a plurality of data lines are disposed on the substrate 11, and the plurality of gate lines are intersected with and insulated from the plurality of data lines, so as to define the plurality of sub-pixel regions. At least one of the sub-pixel regions includes: a first electrode 15 and a second electrode 16 disposed on the substrate 11. The second electrode 16 is located on a side of the first electrode 15 away from the substrate 11, and is insulated from the first electrode 15.

One of the first electrode 15 or the second electrode 16 is a pixel electrode, and the other of the first electrode 15 or the second electrode 16 is a common electrode. The first electrode 15 and the second electrode 16 are both made of transparent conductive materials, and the materials of the first electrode 15 and the second electrode 16 may be the same or different. The transparent conductive materials may be Indium Tin Oxide (ITO), Indium Zinc Oxide (IZO), Aluminum Tin Oxide (ATO), Aluminum Zinc Oxide (AZO), or other suitable metal oxides. Each of the first electrode 15 and the second electrode 16 may be of a single layer or a stack of a plurality of film layers.

The second electrode 16 includes a plurality of electrode bars 161 arranged in parallel along a first direction, and a first slit **16*s* is formed between every two adjacent electrode bars 161 of any second electrode 16. A width W of each electrode bar 161 in the first direction is less than a width of the sub-pixel region in the first direction. In some implementations, a ratio of the width W of at least one of the electrode bars 161** to the width of the sub-pixel region corresponding thereto is in a range from 0.06 to 0.3.

Here, the width W of the electrode bar 161 refers to a dimension of the electrode bar 161 in a direction perpendicular to an extending direction in which the electrode bar 161 extends.

It is found that, in a case where the width W of the electrode bar 161 is relatively large, the larger the area of a region occupied by the electrode bar 161 is, the less the flexoelectric effect of the liquid crystal molecules in the region occupied by the electrode bar 161 is, and thus the more advantageous it is for improving the flicker of image. In the embodiment of the present disclosure, the ratio of the width W of at least one of the electrode bars 161 to the width of the sub-pixel region corresponding to the electrode bar is set to be in a range from 0.06 to 0.3, which is favorable for improving the flicker of image.

In some implementations, the ratio of the width W of each electrode bar 161 to the width of the sub-pixel region corresponding to the electrode bar 161 may be set to be in the range from 0.06 to 0.3.

In some implementations, several sub-pixel regions arranged along the first direction constitute one pixel region, for example, three or four sub-pixel regions arranged along the first direction constitute one pixel region, and sub-pixels in each pixel region are configured to display a plurality of colors, for example, red, green, and blue. In some implementations, the pixel density of the display substrate ranges from 250 PPI to 300 PPI, that is, 250 to 300 pixel regions are arranged per inch of length of the display substrate along the first direction. In an example, each pixel region includes three sub-pixel regions, i.e., 750-900 sub-pixel regions are arranged per inch of length of the display substrate along the first direction, and the width of each electrode bar 161 is in a range from 1.8 μm to 4 μm.

In an example, the pixel density of the display substrate is 270 PPI, and the width W of the electrode bar 161 is 1.8 μm; or, the width W of the electrode bar 161 is 2 μm; or, the width W of the electrode bar 161 is 2 μm; or, the width W of the electrode bar 161 is 2.4 μm; or, the width W of the electrode bar 161 is 2.5 μm; or, the width W of the electrode bar 161 is 3 μm; or, the width W of the electrode bar 161 is 3 μm; or, the width W of the electrode bar 161 is 3 μm; or, the width W of the electrode bar 161 is 3.5 μm; or, the width W of the electrode bar 161 is 3.8 μm; or, the width W of the electrode bar 161 is 4 μm.

In some implementations, for the display substrate, a change value A between transmittances of the display substrate in two adjacent frames and the width W of the electrode bar satisfy the following relational expression: $A=(-0.0228\,W+0.1348)\times k$, k is an error coefficient, and k is greater than 0 and less than 3; for example, k is 1, or 1.1, or 1.5, or 2.

It should be noted that, polarities of driving voltages for any sub-pixel region in two adjacent display periods are opposite, for example, a voltage applied to the common electrode remains unchanged, and the polarities of the pixel voltages applied to the pixel electrodes in any sub-pixel region in two adjacent display periods are opposite. The change value between transmittances of the display substrate in two adjacent frames refers to a ratio of the difference between transmittances of the display substrate in two adjacent display periods to a sum of the transmittances of the display substrate in the two adjacent display periods.

In an actual detection, during the display substrate displaying a test image, brightness at a central position of the display substrate may be collected by using an optical instrument, so that the difference between the transmittances of the display substrate in two adjacent display periods is determined according to the brightness at the central position of the display substrate.

Figure 6:
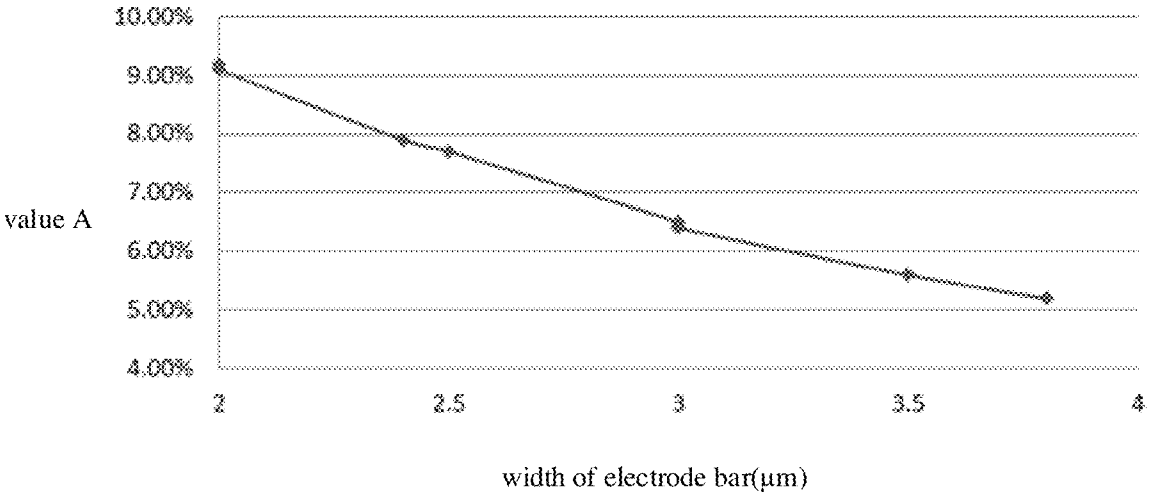
FIG. 6 is a graph showing a relationship between a change value between transmittances of a display substrate in two adjacent frames and a width of an electrode bar.

FIG. 6 is a graph showing a relationship between a change value between transmittances of the display substrate in two adjacent frames and a width of an electrode bar, the graph satisfies the above-mentioned relational expression, and the value of k corresponding to FIG. 6 is 1.

After comprehensively considering the widths of the electrode bars 161, the transmittance and other factors, for the display substrate with the pixel density ranging from 250 PPI to 300 PPI, the width of each electrode bar 161 is set to be in a range from 1.8 μm to 4 μm, so that 2 to 6 electrode bars 161 are arranged in each sub-pixel region, the change value between the transmittances of the display substrate in two adjacent frames is reduced, and the flicker value of the display substrate is thereby reduced. In case where a driving frequency of the display substrate is 60 Hz, the flicker value of the display substrate is less than or equal to −30 dB. The flicker value is a parameter for indicating a degree of flicker of the image, the larger the flicker value is, the higher the degree of the flicker is, and the smaller the flicker value is, the smaller the degree of the flicker is.

In some implementations, the ratio of the width W of at least one of the electrode bars 161 in the first direction to the width S of the first slit 16*s* adjacent to the electrode bar in the first direction is in a range from 0.4 to 1.3. Considering that the relatively large W/S (i.e., W is relatively large, and S is relatively small) may result in lower transmittance of the sub-pixel region, in the embodiment of the present disclosure, the ratio of the width of the electrode bar 161 in the first direction to the width of the first slit 16*s* in the first direction is set to be in a range from 0.4 to 1.3, so that the flicker of image can be eliminated while ensuring the transmittance of the sub-pixel region.

For example, the ratio of the width W of at least one of the electrode bars 161 in the first direction to the width S of the first slit 16*s* in the first direction is 0.4, or 0.5, or 0.55, or 0.6, or 0.63, or 0.75, or 0.8, or 0.85, or 0.88, or 1, or 1.3.

Here, the width S of the first slit 16*s* in the first direction refers to a dimension of the first slit 16S in a direction perpendicular to an extending direction in which the first slit extends.

In an example, the pixel density is 270 PPI, the width W of the electrode bar 161 (the width W of the electrode bar 161 in the first direction) is 1.8 μm, and the width S of the first slit 16*s* is 4 μm (that is, W=1.8 μm, and S=4 μm); or the width W of the electrode bar 161 is 2 μm and the width S of the first slit 16*s* is 4.8 μm; or the width W of the electrode bar is 2 μm and the width S of the first slit 16*s* is 4 μm; or the width W of the electrode bar 161 is 2.4 μm and the width S of the first slit 16*s* is 4.4 μm; or the width W of the electrode bar 161 is 2.5 μm and the width S of the first slit 16*s* is 4 μm; or the width W of the electrode bar 161 is 3 μm and the width S of the first slit 16*s* is 3.5 μm; or the width W of the electrode bar 161 is 3 μm and the width S of the first slit 16*s* is 3 μm; or the width W of the electrode bar 161 is 3 μm and the width S of the first slit 16*s* is 4 μm; or the width W of the electrode bar 161 is 3.5 μm and the width S of the first slit 16*s* is 4 μm; or the width W of the electrode bar 161 is 3.8 μm and the width S of the first slit 16*s* is 3 μm; or, the width W of the electrode bar 161 is 4 μm and the width S of the first slit 16*s* is 4 μm.

Figure 7:
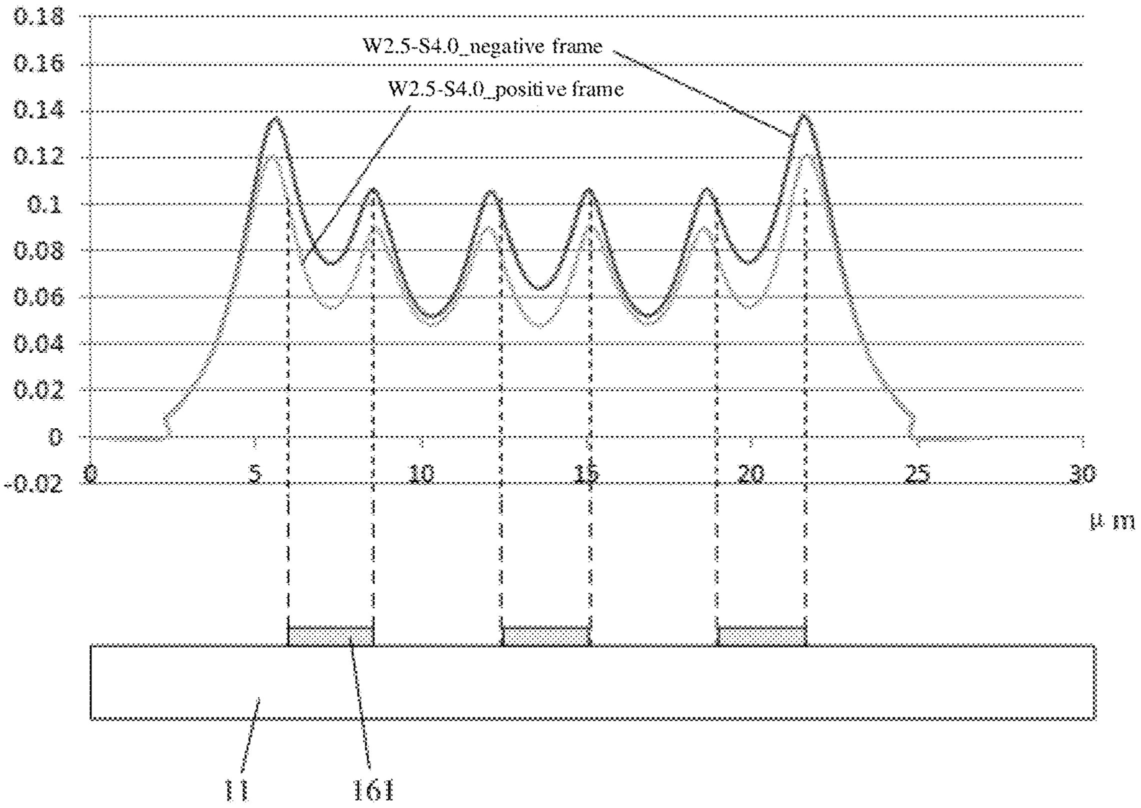
FIG. 7 is a graph showing transmittances of a sub-pixel region corresponding to a positive frame and a negative frame in a case where a width (W) of an electrode bar is 2.5 μm and a width(S) of a slit adjacent to the electrode bar is 4.0 μm.
Figure 8:
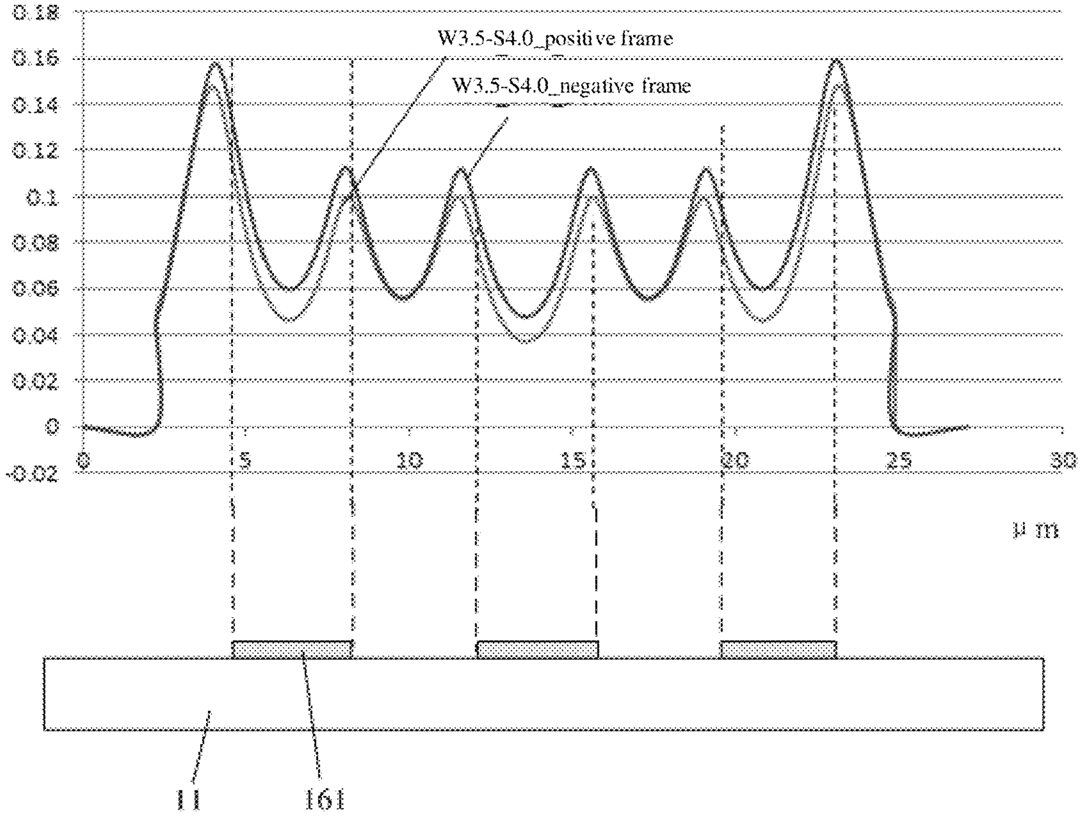
FIG. 8 is a graph showing transmittances of a sub-pixel region corresponding to a positive frame and a negative frame in a case where a width (W) of an electrode bar is 3.5 μm and a width(S) of a slit adjacent to the electrode bar is 4.0 μm.

Table 1 shows values A (i.e., change values between the transmittances of the display substrate in two adjacent frames) corresponding to different W/S, and FIG. 7 is a graph showing transmittances of a sub-pixel region corresponding to a positive frame and a negative frame in a case where W=2.5 μm and S=4.0 μm; FIG. 8 is a graph showing transmittances of a sub-pixel region corresponding to a positive frame and a negative frame in a case where a width (W) of an electrode bar is 3.5 μm and a width(S) of a slit adjacent to the electrode bar is 4.0 μm. The positive frame represents that the driving voltage on the pixel electrode is greater than a voltage on the common electrode; the negative frame represents that the driving voltage on the pixel electrode is less than the voltage on the common electrode. In FIGS. 7 and 8, the horizontal axis represents positions and the vertical axis represents transmittances. Table 1 and graphs in FIG. 7 and FIG. 8 show results obtained by a simulation performed in the case where the pixel density is 270 PPI, the driving frequency is 10 Hz, and the driving voltages for two adjacent frames are −2.1V and 2.1V, respectively. The transmittances in Table 1 are shown by taking the transmittance in a case where W=2.4 μm and S=4.4 μm as a reference. As can be seen from Table 1, FIG. 7 and FIG. 8, in a case where the width of the electrode bar 161 ranges from 2 μm to 3.8 μm, and the width of the first slit 16*s* ranges from 3 μm to 4.8 μm, a relatively low value A can be achieved while ensuring the transmittances.

TABLE 1

| Sum of W and S (μm) | W(μm) | S(μm) | Transmittance | Value A |
|---|---|---|---|---|
| 6.8 | 2 | 4.8 | 98.4% | 9.2% |
| 6 | 2 | 4 | 94.8% | 9.1% |
| 6.8 | 2.4 | 4.4 | 100.0% | 7.9% |
| 6.5 | 2.5 | 4 | 99.3% | 7.7% |
| 6.5 | 3 | 3.5 | 100.1% | 6.5% |
| 6 | 3 | 3 | 97.6% | 6.4% |
| 6.8 | 3 | 4.8 | 101.8% | 6.5% |
| 7 | 3 | 4 | 101.5% | 6.4% |
| 7.5 | 3.5 | 4 | 101.4% | 5.6% |
| 6.8 | 3.8 | 3 | 99.2% | 5.2% |

Figure 9:
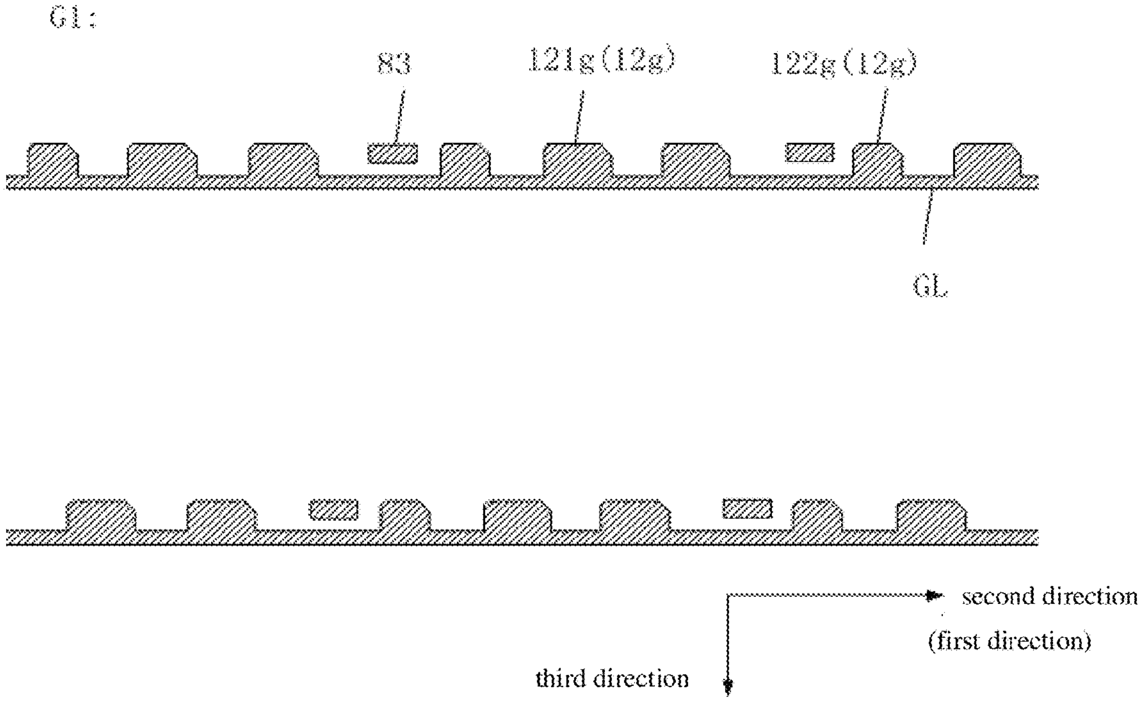
FIG. 9 is a schematic diagram of a gate metal layer provided in some embodiments of the present disclosure.
Figure 10:
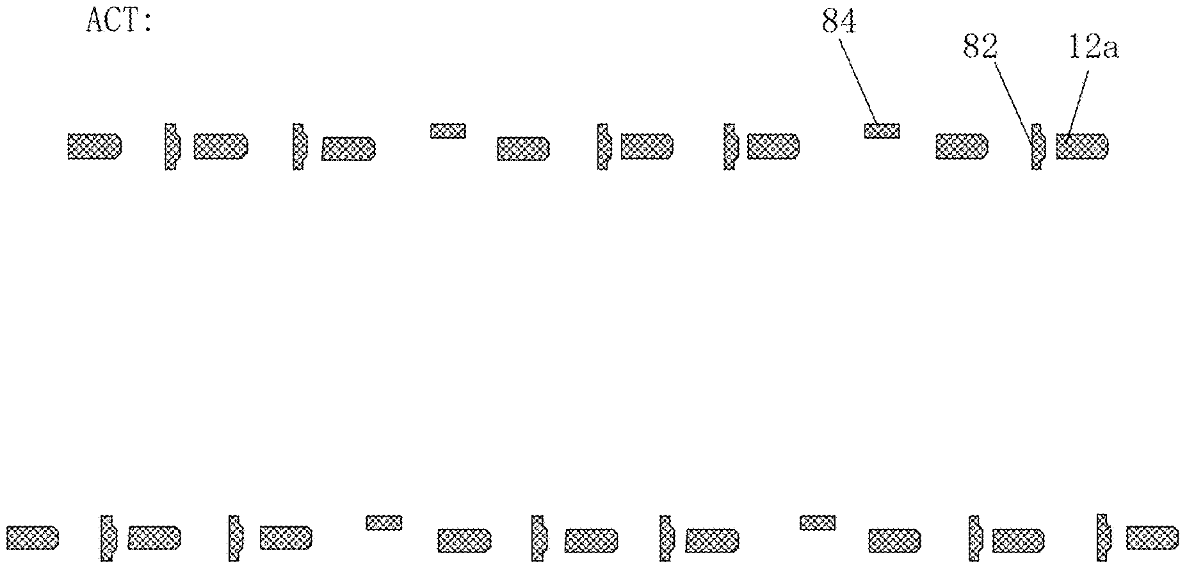
FIG. 10 is a schematic diagram of a semiconductor layer provided in some embodiments of the present disclosure.
Figure 11:
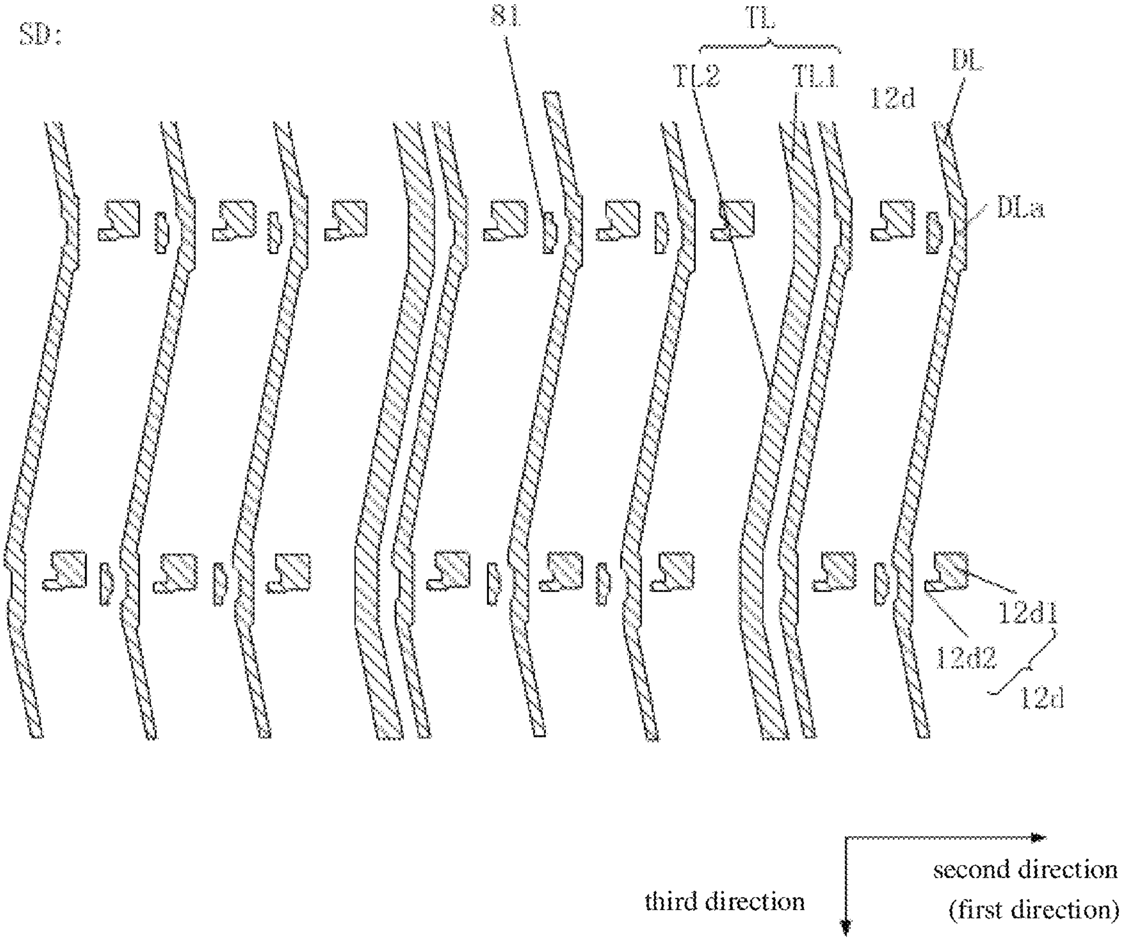
FIG. 11 is a schematic diagram of a source-drain metal layer provided in some embodiments of the present disclosure.
Figure 12:
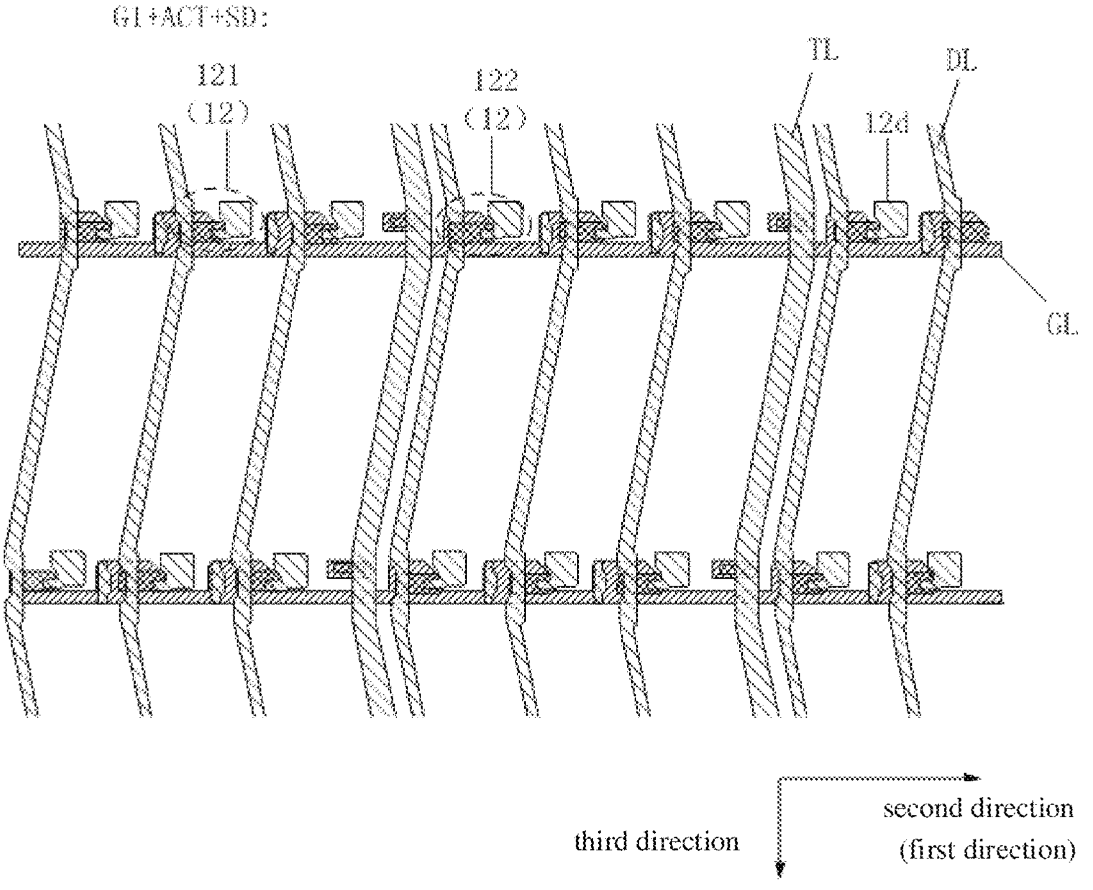
FIG. 12 is a schematic diagram illustrating a stack of a gate metal layer, a semiconductor layer, and a source-drain metal layer provided in some embodiments of the present disclosure.
Figure 13:
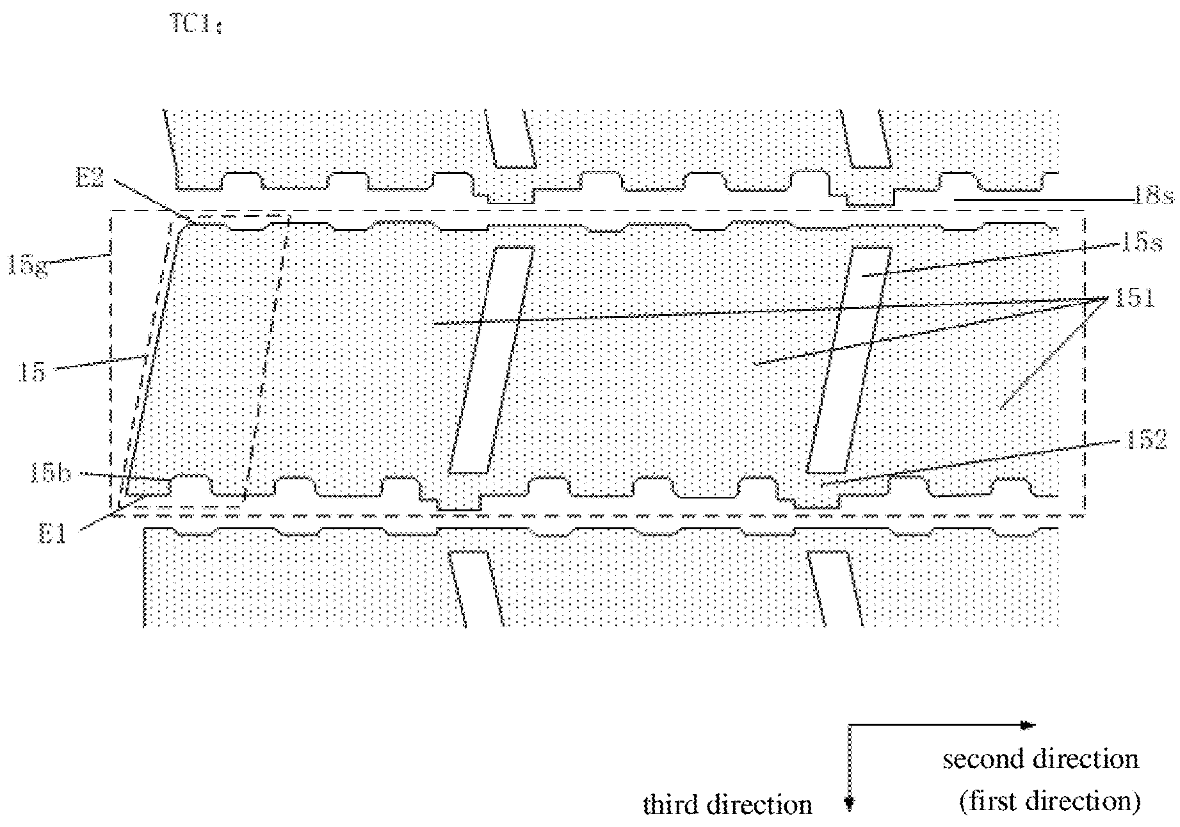
FIG. 13 is a schematic diagram of a first transparent conductive layer provided in some embodiments of the present disclosure.
Figure 14:
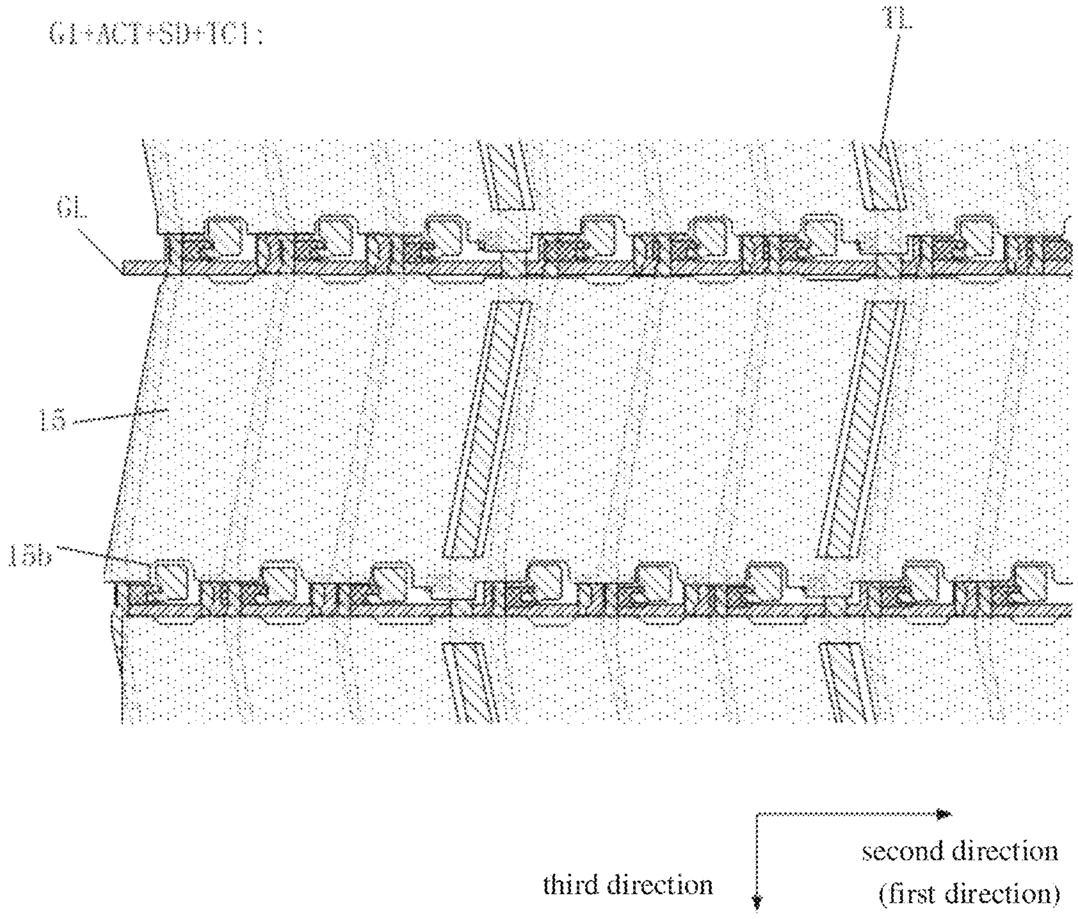
FIG. 14 is a schematic diagram illustrating a stack of a gate metal layer, a semiconductor layer, a source-drain metal layer, and a first transparent conductive layer provided in some embodiments of the present disclosure.
Figure 15:
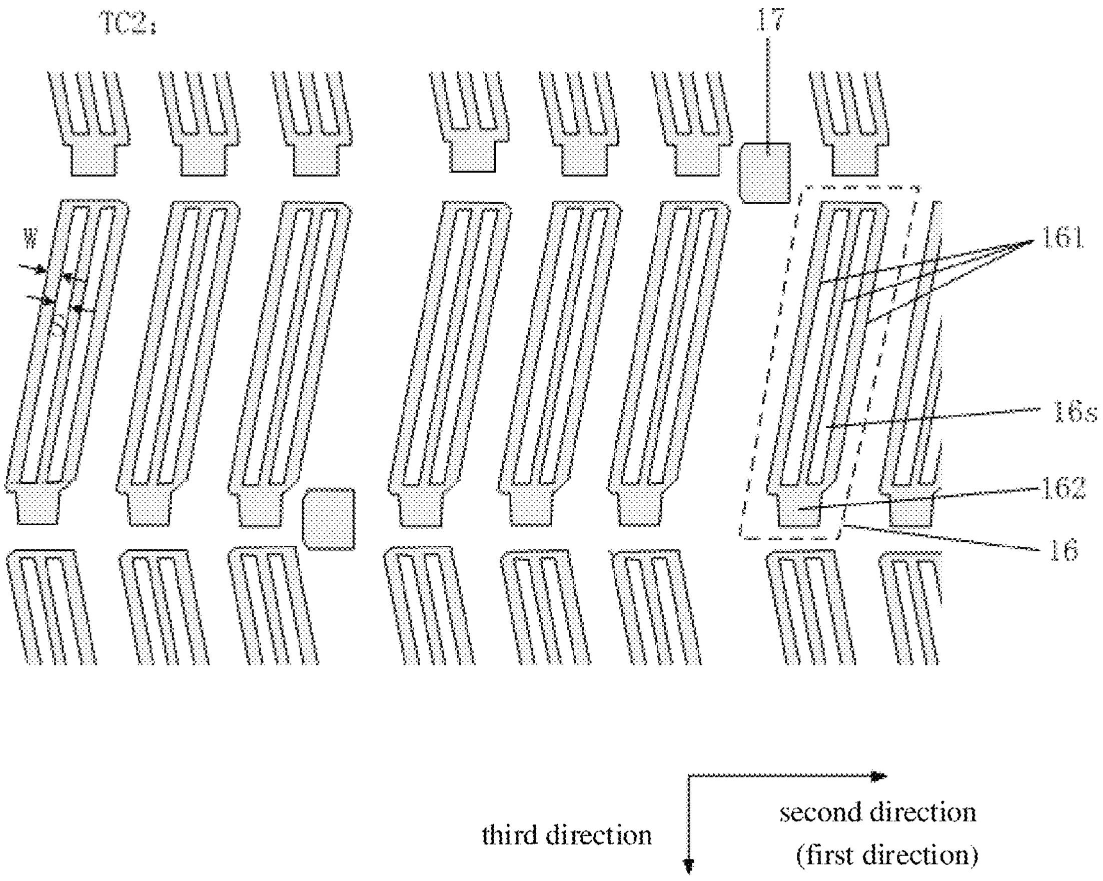
FIG. 15 is a schematic diagram of a second transparent conductive layer provided in some embodiments of the present disclosure.
Figure 16:
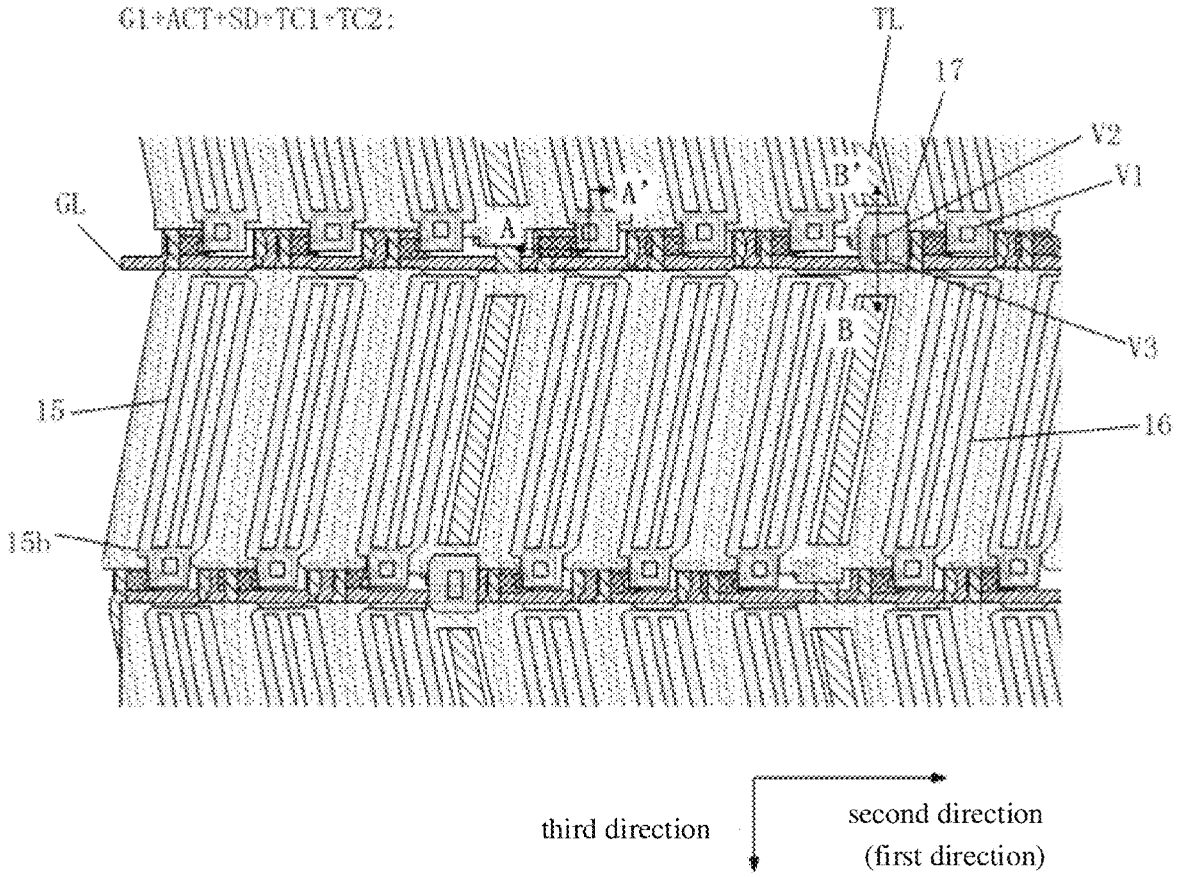
FIG. 16 is a schematic diagram illustrating a stack of a gate metal layer, a semiconductor layer, a source-drain metal layer, a first transparent conductive layer, and a second transparent conductive layer provided in some embodiments of the present disclosure.
Figure 17:
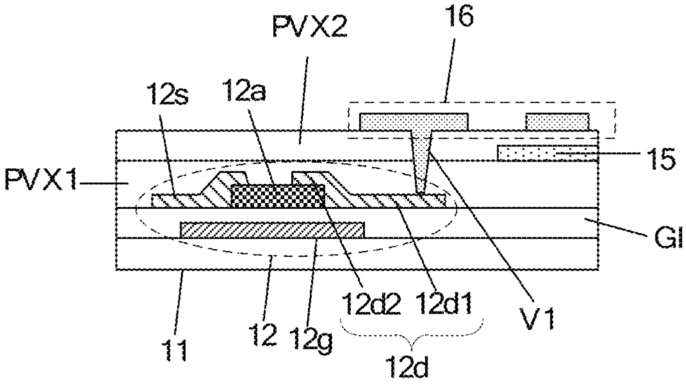
FIG. 17 is a cross-sectional view of a structure in FIG. 16 taken along line A-A'.
Figure 18:
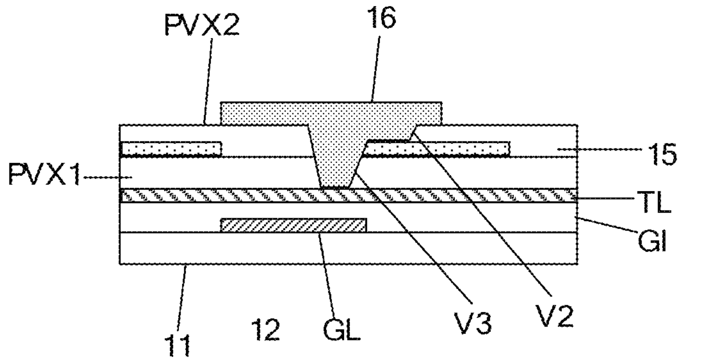
FIG. 18 is a cross-sectional view of a structure in FIG. 16 taken along line B-B'.

FIG. 9 is a schematic diagram of a gate metal layer provided in some embodiments of the present disclosure, FIG. 10 is a schematic diagram of a semiconductor layer provided in some embodiments of the present disclosure, FIG. 11 is a schematic diagram of a source-drain metal layer provided in some embodiments of the present disclosure, FIG. 12 is a schematic diagram illustrating a stack of the gate metal layer, the semiconductor layer, and the source-drain metal layer provided in some embodiments of the present disclosure, FIG. 13 is a schematic diagram of a first transparent conductive layer provided in some embodiments of the present disclosure, FIG. 14 is a schematic diagram illustrating a stack of the gate metal layer, the semiconductor layer, the source-drain metal layer, and the first transparent conductive layer provided in some embodiments of the present disclosure, FIG. 15 is a schematic diagram of a second transparent conductive layer provided in some embodiments of the present disclosure, FIG. 16 is a schematic diagram illustrating a stack of the gate metal layer, the semiconductor layer, the source-drain metal layer, the first transparent conductive layer, and the second transparent conductive layer provided in some embodiments of the present disclosure, FIG. 17 is a cross-sectional view of the structure in FIG. 16 taken along line A-A', and FIG. 18 is a cross-sectional view of a structure in FIG. 16 taken along line B-B'.

As shown in FIGS. 9 to 18, the display substrate further includes a plurality of thin film transistors 12, each sub-pixel region corresponds to one of the thin film transistors 12, a drain electrode of each thin film transistor 12 is electrically connected to a pixel electrode in the sub-pixel region corresponding thereto, and a gate electrode 12*g* of each thin film transistor 12 is electrically connected to one of the gate lines GL. The gate electrode 12*g* of the thin film transistor 12 and the gate line GL both are located in a gate metal layer G1. The gate electrode 12*g* of the thin film transistor 12 and the gate line GL may be connected and formed into one piece, the gate line GL extends along a second direction the same as or different from the first direction. In the embodiments of the present disclosure, taking a case where the first direction and the second direction are the same as an example. In other embodiments, however, the first direction and the second direction may form an included angle therebetween. A material of the gate metal layer may include, for example, a metal, a metal alloy, a metal nitride, a conductive metal oxide, a transparent conductive material, and the like. For example, the gate metal layer may include one or more of gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), tin oxide (SnOx), indium oxide (InOx), gallium oxide (GaOx), indium tin oxide (ITO), indium zinc oxide (IZO), molybdenum niobium (MoNb), molybdenum niobium titanium (MTD), and the gate metal layer may have a single-layer or multi-layer structure.

The gate insulating layer GI is disposed on a side of the gate metal layer away from the substrate 11, and may include silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), and the like. The gate insulating layer GI may be formed into a single-layer structure or a multi-layer structure.

The semiconductor layer ACT is provided on a side of the gate insulating layer GI away from the substrate 11, and includes active layers 12*a* of the thin film transistors 12. Each active layer 12*a* may include, for example, an inorganic semiconductor material (e.g., polysilicon, amorphous silicon, etc.), an organic semiconductor material, an oxide semiconductor material. In some embodiments of the present disclosure, the thin film transistors 12 may be oxide thin film transistors 12, and the active layers 12*a* are oxide semiconductor layers, thereby facilitating to reduce a leakage current of the thin film transistors 12. Each active layer 12*a* may include a channel region disposed opposite to the gate electrode 12*g*, and a source region and a drain region respectively located at both sides of the channel region. The source region and the drain region may each include impurities having a higher impurity concentration than the channel region. The impurities may include N-type impurities or P-type impurities.

The source-drain metal layer SD is disposed on a side of the semiconductor layer ACT away from the substrate 11, and includes the plurality of data lines DL, and the source electrodes 12*s* and the drain electrodes 12*d* of the thin film transistors 12. The source electrode 12*s* of the thin film transistor 12 is electrically connected to the source region in the active layer 12*a* of the thin film transistor, and the drain electrode 12*d* of the thin film transistor 12 is electrically connected to the drain region in the active layer 12*a* of the thin film transistor. In addition, the display substrate in the embodiment of the present disclosure may further have a touch function, and accordingly, the display substrate further includes a plurality of touch signal lines TL, and in some implementations, the touch signal lines TL are disposed in the same layer as the data lines DL and the source electrodes 12*s* and the drain electrodes 12*d* of the thin film transistors 12, so that the patterning process can be simplified. The source-drain metal layer may include one or more of gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiN x), platinum (Pt), tantalum (Ta), tantalum nitride (TaNx), neodymium (Nd), scandium (Sc), strontium ruthenium oxide (SRO), zinc oxide (ZnOx), tin oxide (SnOx), indium oxide (InOx), gallium oxide (GaOx), indium tin oxide (ITO), indium zinc oxide (IZO), molybdenum niobium (MoNb), molybdenum niobium titanium (MTD), and the source-drain metal layer may have a single-layer structure or a multi-layer structure.

The touch signal lines TL and the data lines DL may extend along a third direction. The touch signal lines TL (or the data lines DL) extending along the third direction means that the touch signal lines TL (or the data lines DL) extend along the third direction substantially. The touch signal lines TL (or the data lines DL) may be straight lines or may bent to a certain extent, but have an overall trend extending along the third direction. The second direction intersects the third direction, e.g., the second direction is perpendicular to the third direction.

A first passivation layer PVX1 is disposed on a side of the thin film transistors 12 away from the substrate 11, and a material of the first passivation layer PVX1 may include silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), or the like. The first passivation layer PVX1 may be formed as a single-layer structure or a multi-layer structure.

The first transparent conductive layer TC1 is disposed on a side of the first passivation layer PVX1 away from the substrate 11, and the first transparent conductive layer TC1 may include a first electrode 15. In the embodiment of the present disclosure, the first electrode 15 may be the common electrode.

In some implementations, the first electrodes 15 of the sub-pixel regions constitute a first electrode layer including a plurality of first sub-electrodes 151 arranged in an array along the second direction and the third direction. An orthographic projection of each first sub-electrode 151 on the substrate 11 may overlap with one or more sub-pixel regions. That is to say, a portion of the first sub-electrode 151 located in the sub-pixel region serves as the first electrode.

A second slit 15*s* exists between every two adjacent first sub-electrodes 151 arranged in the second direction; an orthographic projection of the second slit 15*s* on the substrate 11 overlaps with an orthographic projection of the touch signal line TL on the substrate 11, so as to reduce an overlapping area between the touch signal line TL and the first electrode layer, thereby reducing a parasitic capacitance between the touch signal line TL and the first electrode layer, and reducing or preventing the influence of the parasitic capacitance on the signal in the touch signal line TL.

As shown in FIG. 11, each touch signal line TL may be a meander line including first line segments TL1 and second line segments TL2 alternately arranged in a third direction and connected with each other, and the first line segments TL1 extend in a direction different from a direction in which the second line segments TL2 extend. Each second slit 15*s* corresponds to one of the first line segments TL1 or one of the second line segments TL2, an extending direction in which each second slit 15*s* extends is the same as an extending direction in which the first line segment TL1 or second line segment TL2 corresponding to the second slit 15*s* extends, and an orthographic projection of each second slit 15*s* on the substrate 11 overlaps with an orthographic projection of the first line segment TL1 or second line segment TL2 corresponding to the second slit 15*s* on the substrate 11.

In some implementations, a width of the second slit 15*s* may be greater than or equal to a width of the touch signal line TL, and both two opposite side edges of the touch signal line TL are partially exposed by the second slit 15*s*, so that the overlapping area between the touch signal line TL and the first electrode layer is further reduced.

The orthographic projection of the touch signal line TL on the substrate 11 and an orthographic projection of the data line DL on the substrate 11 are not overlapped.

In some implementations, a width of the touch signal line TL is greater than a width of the data line DL, so as to facilitate reducing the resistance of the touch signal line, and further facilitate improving the touch sensitivity.

In some implementations, the width of the touch signal line TL is 1.5 to 3 times the width of the data line DL. In an example, the width of the touch signal line TL ranges from 4.5 μm to 7 μm, and the width of the data line DL ranges from 1.5 μm to 3.5 μm. For example, the width of the touch signal line TL is 4.5 μm, and the width of the data line DL is 1.5 μm; for another example, the width of the touch signal line TL is 5 μm, and the width of the data line DL is 2 μm; for another example, the width of the touch signal line TL is 5.8 μm, and the width of the data line DL is 2.8 μm.

In some implementations, a third slit 18*s* is provided between every two adjacent first sub-electrodes 151 arranged in the third direction, the third slit 18*s* may extend along the second direction, and the third slit 18*s* exposes at least a portion of the gate line GL and the drain electrode 12*d* of the thin film transistor 12. That is, an orthographic projection of at least a portion of the gate line GL on the substrate 11 does not overlap an orthographic projection of the first electrode 15 on the substrate 11, and an orthographic projection of the drain electrode 12*d* of the thin film transistor 12 on the substrate 11 does not overlap the orthographic projection of the first electrode 15 on the substrate 11, so that a parasitic capacitance between the first electrode 15 and the gate line GL and a parasitic capacitance between the first electrode 15 and the drain electrode 12*d* of the thin film transistor 12 can be reduced.

In some implementations, the orthographic projection of each first sub-electrode 151 on the substrate 11 overlaps with one or more sub-pixel regions. For example, the orthographic projection of each first sub-electrode 151 on the substrate 11 overlaps with two, three, four or five sub-pixel regions. In addition, the first sub-electrodes 151 may be divided into a plurality of electrode groups 15*g*, each electrode group 15*g* may include multiple first sub-electrodes 151 arranged along the second direction and connected in sequence, two adjacent first sub-electrodes 151 in any electrode group 15*g* may be connected by two sub-electrode connection portions 152, and the two adjacent first sub-electrodes 151 and the two sub-electrode connection portions 152 between the two adjacent first sub-electrodes 151 enclose the second slit 15*s*. The sub-electrode connection portions 152 and the first sub-electrodes 151 may be formed into one piece. Each electrode group 15*g* may be connected to one of the touch signal lines TL, with different electrode groups 15*g* being connected to different touch signal lines TL.

As shown in FIGS. 17 and 18, a second passivation layer PVX2 is provided on a side of a layer, where the first electrode 15 is located, away from the substrate 11. The second passivation layer PVX2 is disposed on a side of the thin film transistors 12 away from the substrate 11, and a material of the first passivation layer PVX1 may include silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), or the like. The second passivation layer PVX2 may be formed as a single-layer structure or a multi-layer structure.

The second transparent conductive layer TC2 is disposed on a side of the second passivation layer PVX2 away from the substrate 11, and the second transparent conductive layer TC2 may include a plurality of second electrodes 16. The second electrodes 16 are pixel electrodes, and each pixel electrode corresponds to one of the sub-pixel regions. Each second electrode 16 includes a plurality of electrode bars 161 and a connection portion 162, and the connection portion 162 is connected to each of the electrode bars 161 and is connected to the drain electrode 12*d* of the thin film transistor 12 through a first via hole V1 penetrating through the first passivation layer PVX1 and the second passivation layer PVX2.

In some implementations, as shown in FIG. 11, the drain electrode 12*d* of each thin film transistor 12 includes a drain body portion 12*d*1 and a drain connection portion 12*d*2, the drain connection portion 12*d*2 is connected to the active layer of the thin film transistor, and an orthographic projection of the drain body portion 12*d*1 on the substrate 11 is located outside an orthographic projection of the active layer of the thin film transistor on the substrate 11. In an example, the second electrode 16 is electrically connected to the drain body portion 12*d*1, and an orthographic projection of the second electrode 16 on the substrate 11 completely covers the orthographic projection of the drain body portion 12*d*1 on the substrate 11, thereby ensuring reliability of a connection between the second electrode 16 and the thin film transistor.

In the embodiment of the present disclosure, the first electrodes 15 serve as the common electrode in a display period; and serve as touch electrodes in a touch period, and is electrically connected with the touch signal lines TL to receive the touch signals in the touch signal lines TL. With such arrangement, the structure of the display substrate can be simplified. The first electrode 15 may be connected to the touch signal line TL through a transfer electrode 17. Specifically, the transfer electrode 17 and the second electrode 16 are disposed in a same layer, and the transfer electrode 17 is electrically connected to the first electrode 15 through a second via hole V2 penetrating through the second passivation layer PVX2, and is connected to the touch signal line TL through a third via hole V3 penetrating through the first passivation layer PVX1 and the second passivation layer PVX2.

Here, the second via hole V2 and the third via hole V3 may be communicated, and in this case, the transfer electrode 17 may contact not only a surface of the first electrode 15 away from the substrate 11, but also a side surface of the first electrode 15, so as to improve the stability of a connection between the transfer electrode 17 and the first electrode 15.

It can be understood that if the first electrode 15 serves as the pixel electrode and the second electrode 16 serves as the common electrode, the via hole for connecting the pixel electrode with the thin film transistor 12 and the via hole for connecting the common electrode with the touch signal line TL are to be separately fabricated by different patterning processes. In the embodiment of the present disclosure, the first electrode 15 serves as the common electrode, and the second electrode 16 serves as the pixel electrode (i.e., the common electrode is lower, and the pixel electrode is upper) so as to obtain the following advantages: after the thin film transistors 12 are manufactured, the first passivation layer PVX1, the first electrode 15, and the second passivation layer PVX2 may be formed in sequence; then, the first via hole V1, the second via hole V2 and the third via hole V3 are simultaneously formed through a single patterning process; finally, the second electrode 16 and the transfer electrode 17 are simultaneously formed by a single patterning process. That is, the via hole for connecting the pixel electrode with the thin film transistor 12 and the via hole for connecting the common electrode with the touch signal line TL may be formed through a single patterning process, thereby simplifying the manufacturing process and reducing the manufacturing cost.

In the embodiment of the present disclosure, the display substrate may further include a common voltage line (not shown), and each of the first sub-electrodes 151 is electrically connected to the common voltage line, and the common voltage line is configured to supply a common voltage signal to the first sub-electrodes 151 in the display period. In an example, the common voltage line may be disposed in the same layer as the gate lines GL, and each of the first sub-electrodes 151 is electrically connected to the common voltage line through a via hole.

In some implementations, as shown in FIG. 9, the thin film transistors 12 may include a plurality of first thin film transistors 121 and a plurality of second thin film transistors 122, that is, a portion of the thin film transistors 12 in the display substrate may serve as the first thin film transistors 121, and another portion of the thin film transistors 12 may serve as the second thin film transistors 122. In an example, each gate line GL may be connected with multiple first thin film transistors 121 and multiple second thin film transistors 122.

A width of a gate electrode 121*g* of each first thin film transistor 121 in the second direction is greater than a width of a gate electrode 122*g* of each second thin film transistor 122 in the second direction.

In some implementations, a difference between the widths of the gate electrode 121*g* of the first thin film transistor 121 and the gate electrode 122*g* of the second thin film transistor 122 in the second direction is in a range from 6 μm to 10 μm, for example, may be 6 μm, 8 μm, or 10 μm.

As shown in FIG. 11, the display substrate further includes a plurality of first support parts 81 located on a side of the gate electrodes 121*g* of the first thin film transistors 121 away from the substrate 11, and an orthographic projection of each first support part 81 on the substrate 11 overlaps with an orthographic projection of the gate electrode 121*g* of one of the first thin film transistors 121 on the substrate 11. In an example, a width of the first support part 81 in the third direction may be the same as or approximate to a width of the gate electrode 121*g* of the first thin film transistor 121 in the third direction.

In an example, the plurality of first support ports 81 may be located in the source-drain metal layer SD, that is, the plurality of first support parts 81 may be disposed in the same layer as the source electrodes and the drain electrodes 12*d* of the plurality of thin film transistors 12 and the data lines DL, so that the first support parts 81, the source electrodes and the drain electrodes 12*d* of the thin film transistors 12 and the data lines DL may be simultaneously manufactured by a single patterning process to simplify the manufacturing process.

In an example, an orthographic projection of the first support part 81 on the substrate 11 may be in a shape of an ellipse, a polygon, or the like. For example, the orthographic projection of the first support part 81 on the substrate 11 is rectangular, hexagonal, or the like.

In an example, the first support part 81 is floated, i.e., the first support part 81 is insulated from the data lines DL and the thin film transistors 12.

In some implementations, at least one edge of the data line DL has a recess DLa therein, and an orthographic projection of the recess DLa on the substrate 11 is within an orthographic projection of the gate electrode of the thin film transistor on the substrate 11. The edge of the data line DL refers to one of edges of the data line DL extending in a length direction thereof. With the recess DLa, a portion of the data line DL overlapping with the gate metal layer G1 may have a relatively small width, thereby reducing a parasitic capacitance between the data line DL and the gate metal layer G1.

In some implementations, a depth of the recess DLa is less than or equal to half of the width of the data line DL, thereby reducing the parasitic capacitance between the data line DL and the gate metal layer G1 while ensuring the signal transmission effect of the data line DL. Here, the depth of the recess DLa refers to a dimension of the recess DLa in the second direction. In an example, the width of the data line DL ranges from 2 μm to 3 μm, and the depth of the recess DLa is less than or equal to 1 μm.

In some implementations, each of the first support parts 81 is adjacent to one of the data lines DL. Note that the first support part 81 being adjacent to one of the data lines DL means that no other structure is provided between the first support part 81 and the data line DL. In some implementations, the data line DL adjacent to the first support part 81 has the above-described recess DLa at the edge thereof close to the first support part 81, and the recess DLa is bent toward a direction away from the first support part 81. For example, if one of the first support parts 81 is adjacent to one of the data lines DL on the right side thereof, and the left edge of the data line DL is provided with the recess DLa facing the first support part 81 and bent rightward.

In some implementations, as shown in FIG. 10, the display substrate further includes a plurality of second support parts 82, the second support parts 82 are disposed in the same layer as the active layers 12*a* of the thin film transistors 12, and an orthographic projection of each of the second support parts 82 on the substrate 11 overlaps with an orthographic projection of one of the first support parts 81 on the substrate 11. For example, the orthographic projection of each of the second supports 82 on the substrate 11 substantially coincides with the orthographic projection of one of the first support parts 81 on the substrate 11.

In some implementations, as shown in FIGS. 9 and 10, the display substrate may further include: a plurality of third support parts 83 and a plurality of fourth support parts 84, the third support parts 83 are disposed in the same layer as the gate lines GL, and an orthographic projection of each third support part 83 on the substrate 11 overlaps an orthographic projection of one of the touch signal lines TL on the substrate 11. The fourth support part 84 is disposed in the same layer as the active layer 12*a* of the thin film transistor 12. Each fourth support part 84 corresponds to one of the third support parts 83, and an orthographic projection of the fourth support part 84 on the substrate 11 overlaps an orthographic projection of one of the third support parts 83 on the substrate 11.

In an example, the orthographic projection of the third support part 83 on the substrate 11 may partially overlap the orthographic projection of one of the touch signal lines TL on the substrate 11; the orthographic projection of the fourth support part 84 on the substrate 11 may partially overlap the orthographic projection of one of the touch signal lines TL on the substrate 11.

In a case where the display substrate is applied in a display panel, a plurality of spacers may be arranged between the display substrate and a color filter substrate, so that the display panel is supported. One of the first support part 81, one of the second support parts 82 corresponding to the first support part 81, and a portion of the gate metal layer G1 corresponding to the first support part 81 form a first support group; and one of the third support parts 83, one of the fourth support parts 84 corresponding to the third support part 83, and a portion of the source-drain metal layer SD corresponding to the third support part 83 form a second support group, and each first support group and each second support group correspond to a position of one of the spacers. By providing the first support parts 81, the second support parts 82, the third support parts 83, and the fourth support parts 84, the support stability of the spacers is improved.

In an example, each sub-pixel region corresponds to one of the spacers, and each spacer is arranged opposite to one first support group or one second support group.

In some implementations, an orthographic projection of the first sub-electrode 151 on the substrate 11 overlaps an orthographic projection of the second electrode 16 on the substrate 11. The first sub-electrode 151 and the second electrode 16 having the orthographic projection overlapping with the orthographic projection of the first sub-electrode 151 form an electrode unit, and in each electrode unit, the first sub-electrode 151 includes a first edge E1 and a second edge E2 oppositely arranged in the third direction, the first edge E1 is adjacent to the thin film transistor 12 connected to the second electrode 16, the first edge E1 has a bent portion 15*b*, the bent portion 15*b* is opposite to the drain electrode 12*d* of the thin film transistor 12 adjacent thereto, and is bent in a direction away from the drain electrode 12*d* of the thin film transistor 12, so as to prevent a parasitic capacitance generated between the first sub-electrode 151 and the drain electrode 12*d* of the thin film transistor.

Figure 19:
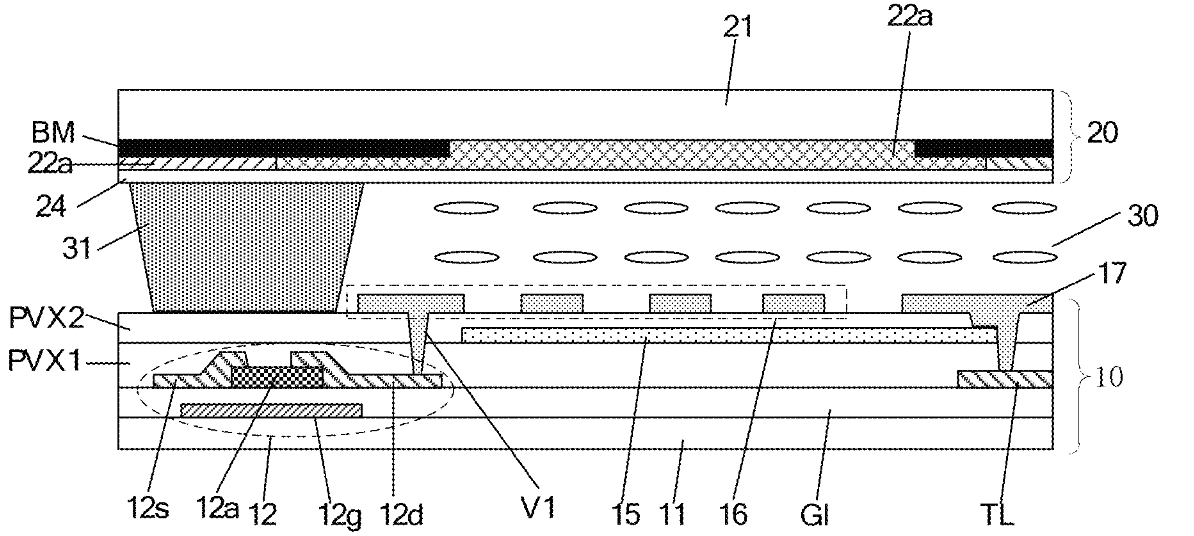
FIG. 19 is a cross-sectional view of a display panel provided in some embodiments of the present disclosure.

FIG. 19 is a cross-sectional view of a display panel provided in some embodiments of the present disclosure, as shown in FIG. 19, the display panel includes: the display substrate 10 described above, a color filter substrate 20 disposed opposite to the display substrate 10, and a liquid crystal layer 30 disposed between the display substrate and the color filter substrate.

The color filter substrate 20 includes: a substrate 21, a color filter layer and a black matrix BM. The color filter layer and the black matrix BM are disposed on a side of the substrate 21 facing the display substrate 10. The color filter layer includes a plurality of color filter portions 22*a*, for example, a plurality of red filter portions, a plurality of blue filter portions, and a plurality of green filter portions, an orthographic projection of each of the color filter portions 22*a* on the display substrate overlaps with one of the sub-pixel regions, and orthographic projections of different ones of the color filter portions 22*a* on the display substrate 10 overlap with different ones of the sub-pixel regions. An orthographic projection of the black matrix BM on the substrate 11 of the display substrate 10 covers the orthographic projections of the gate lines GL, the data lines DL and the touch signal lines TL on the substrate 11 of the display substrate 10.

A cover layer 20 is further provided on a side of the color filter layer away from the substrate 21, and the cover layer 20 may be made of an organic material, such as optical glue.

Alignment layers may be disposed on both a side of the color filter substrate 20 facing the display substrate 10 and a side of the display substrate 10 facing the color filter substrate 20, respectively, for aligning liquid crystal molecules in the liquid crystal layer 30.

The display panel may further include a plurality of spacers 31, and the spacers 31 are located between the color filter substrate 20 and the display substrate 10, for supporting the display panel and maintaining a thickness of a cell formed by the display substrate and the color filter substrate of the display panel. The plurality of spacers 31 may include a plurality of main spacers and a plurality of auxiliary spacers, and a height of each main spacer may be greater than a height of each auxiliary spacer.

An embodiment of the present disclosure further provides a display device, which includes the display panel in the above embodiments. The display device may include any apparatus or product having a display function. For example, the display device may be a smart phone, a mobile phone, an e-book reader, a desktop computer (PC), a laptop PC, a netbook PC, a personal digital assistant (PDA), a portable multimedia player (PMP), a digital audio player, an ambulatory medical device, a camera, a wearable device (e.g., a head-mounted device, an electronic apparel, an electronic bracelet, an electronic necklace, an electronic accessory, an electronic tattoo, or a smart watch), a television, and so forth.

It will be understood that the above embodiments are merely exemplary embodiments employed to illustrate the principles of the present disclosure, and the present disclosure is not limited thereto. It will be apparent to those skilled in the art that various changes and modifications may be made without departing from the spirit and scope of the present disclosure, and these changes and modifications are to be considered within the scope of the present disclosure.

What is claimed is:

1. A display substrate, comprising a substrate, the substrate comprising a plurality of sub-pixel regions, wherein at least one of the sub-pixel regions comprises: a first electrode and a second electrode arranged on the substrate, the second electrode being located on a side of the first electrode away from the substrate, and the second electrode and the first electrode being insulated from each other;

the second electrode comprises a plurality of electrode bars arranged in parallel along a first direction, and a first slit is formed between every two adjacent electrode bars in any second electrode; a width of the electrode bar in the first direction is smaller than a width of the sub-pixel region in the first direction, and each sub-pixel region comprises at least three electrode bars therein; a ratio of a width of at least one of the electrode bars to the width of the sub-pixel region corresponding thereto ranges from 0.06 to 0.3, and wherein one of the first electrode or the second electrode is a pixel electrode, and the other of the first electrode or the second electrode is a common electrode.

2. The display substrate of claim 1, wherein a ratio of the width of at least one of the electrode bars in the first direction to a width of the first slit adjacent to the electrode bar ranges from 0.4 to 1.3.

3. The display substrate of claim 1, wherein 750 to 900 sub-pixel regions are arranged per inch of length in the first direction, and the width of the electrode bar in the first direction ranges from 1.8 μm to 4 μm.

4. The display substrate of claim 1, wherein a change value between transmittances of the display substrate in two adjacent frames and the width of the electrode bar satisfy the following relational formula:

$$A=(-0.0228W+0.1348)\times k,$$

wherein W is the width of the electrode bar, A is the change value between transmittances of the display substrate in two adjacent frames, k is an error coefficient, and k is greater than 0 and less than 3.

5. The display substrate of claim 1, further comprising:

a plurality of gate lines arranged in a second direction, the second direction being the same as or different from the first direction; and a plurality of thin film transistors, each thin film transistor is electrically connected with the pixel electrode of one of the sub-pixel regions and is electrically connected with one of the gate lines.

6. The display substrate of claim 5, wherein the thin film transistors comprise a plurality of first thin film transistors and a plurality of second thin film transistors, a width of a gate electrode of the first thin film transistor in the second direction is larger than a width of a gate electrode of the second thin film transistor in the second direction; and wherein the display substrate further comprises a plurality of first support parts located on a side of gate electrodes of the first thin film transistors away from the substrate, and an orthographic projection of each first support part on the substrate is overlapped with an orthographic projection of the gate electrode of one of the first thin film transistors on the substrate.

7. The display substrate of claim 6, wherein the first support parts are disposed in the same layer as source electrodes and drain electrodes of the thin film transistors.

8. The display substrate of claim 6, wherein a difference between widths of the gate electrode of the first thin film transistor and the gate electrode of the second thin film transistor in the second direction is in a range from 6 μm to 10 μm.

9. The display substrate of claim 6, further comprising:

a plurality of second support parts, an orthographic projection of each second support part on the substrate is overlapped with an orthographic projection of one of the first support parts on the substrate, wherein the second support parts and active layers of the thin film transistors are disposed in a same layer.

10. The display substrate of claim 5, wherein an orthographic projection of at least a portion of the gate line on the substrate is not overlapped with an orthographic projection of the first electrode on the substrate.

11. The display substrate of claim 5, further comprising:

a plurality of data lines, each of the plurality of data lines extending in a third direction, the third direction intersecting the second direction, wherein an orthographic projection of each data line on the substrate is overlapped with the orthographic projection of gate electrodes of the thin film transistors on the substrate; at least one edge of each data line is provided with a recess, and an orthographic projection of the recess on the substrate is located in an orthographic projection of the gate electrode of the thin film transistor on the substrate, and a depth of the recess is less than or equal to half a width of the data line.

12. The display substrate of claim 11, further comprising:

a plurality of touch signal lines arranged in the same layer as source electrodes and drain electrodes of the thin film transistors, each of the plurality of touch signal lines extending in the third direction, wherein the first electrode serves as a touch electrode and is electrically connected with one of the touch signal lines, and a width of each touch signal line is 1.5 to 3 times a width of the data line.

13. The display substrate of claim 12, further comprising:

a plurality of third support parts arranged in the same layer as the gate lines, and an orthographic projection of each third support part on the substrate is overlapped with an orthographic projection of one of the touch signal lines on the substrate; and a plurality of fourth support parts arranged in the same layer as active layers of the thin film transistors; each fourth support part corresponds to one of the third support parts, and an orthographic projection of the fourth support part on the substrate is overlapped with an orthographic projection of one of the third support parts.

14. The display substrate of claim 12, wherein first electrodes of the plurality of sub-pixel regions constitute a first electrode layer, the first electrode layer comprising a plurality of first sub-electrodes arranged in an array along the second direction and the third direction; and a second slit is arranged between every two adjacent first sub-electrodes arranged in the second direction, and an orthographic projection of the second slit on the substrate is overlapped with an orthographic projection of the touch signal line on the substrate.

15. The display substrate of claim 14, wherein an orthographic projection of the first sub-electrode on the substrate is overlapped with an orthographic projection of the second electrode on the substrate;

the first sub-electrode and the second electrode having the orthographic projection on the substrate overlapped with the orthographic projection of the first sub-electrode form an electrode unit, and in each electrode unit, the first sub-electrode comprises a first edge and a second edge which are oppositely arranged in the third direction, the first edge is adjacent to the thin film transistor connected with the second electrode, the first edge is provided with a bent portion, and the bent portion is opposite to a drain electrode of the thin film transistor adjacent thereto and is bent in a direction away from the thin film transistor.

16. The display substrate of claim 14, wherein a width of the second slit is greater than or equal to a width of the touch signal line.

17. The display substrate of claim 5, wherein the second electrode further comprises a connection portion connected with the plurality of electrode bars, an orthographic projection of at least a part of the connection portion on the substrate is located outside an orthographic projection of the first electrode on the substrate, and the connection portion is connected to a drain electrode of the thin film transistor through a first via hole; and an orthographic projection of the first via hole on the substrate is located outside the orthographic projection of the first electrode on the substrate.

18. The display substrate of claim 1, wherein in a case where a driving frequency of the display substrate is 60 Hz and driving voltages in each sub-pixel region in two adjacent frames are opposite in polarity, a flicker value of the display substrate is less than −30 dB.

19. The display substrate of claim 1, further comprising:

a plurality of thin film transistors arranged between a layer where the first electrode is located and the substrate;

a first passivation layer arranged between the plurality of thin film transistors and the layer where the first electrode is located;

a second passivation layer arranged between the layer where the first electrode is located and a layer where the second electrode is located;

a plurality of touch signal lines arranged in the same layer as a source electrode and a drain electrode of each of the thin film transistors;

a plurality of transfer electrodes arranged in the same layer as the second electrode, wherein the second electrode is connected to the drain electrode of the thin film transistor through a first via hole penetrating through the first passivation layer and the second passivation layer;

each transfer electrode is electrically connected with the first electrode through a second via hole penetrating through the second passivation layer and is connected with the touch signal line through a third via hole penetrating through the first passivation layer and the second passivation layer.

20. The display substrate of claim 19, wherein the second via hole and the third via hole corresponding to any transfer electrode are communicated.

* * * * *